US 9,847,458 B2

(12) United States Patent
Lee et al.

(10) Patent No.: US 9,847,458 B2
(45) Date of Patent: Dec. 19, 2017

(54) LIGHT EMITTING DIODE AND METHOD OF FABRICATING THE SAME

(71) Applicant: SEOUL VIOSYS CO., LTD., Ansan-si (KR)

(72) Inventors: So Ra Lee, Ansan-si (KR); Yeo Jin Yoon, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/056,702

(22) Filed: Feb. 29, 2016

(65) Prior Publication Data

US 2016/0181477 A1 Jun. 23, 2016

Related U.S. Application Data

(63) Continuation of application No. PCT/KR2015/008840, filed on Aug. 24, 2015.

(30) Foreign Application Priority Data

Aug. 27, 2014 (KR) .................. 10-2014-0112387
Aug. 18, 2015 (KR) .................. 10-2015-0116046

(51) Int. Cl.
*H01L 33/38* (2010.01)
*H01L 33/42* (2010.01)
(Continued)

(52) U.S. Cl.
CPC .............. *H01L 33/38* (2013.01); *H01L 33/40* (2013.01); *H01L 33/42* (2013.01); *H01L 33/46* (2013.01)

(58) Field of Classification Search
None
See application file for complete search history.

(56) References Cited

U.S. PATENT DOCUMENTS 8,017,963 B2 * 9/2011 Donofrio ................ H01L 33/46
257/95
2006/0091405 A1 * 5/2006 Kwak ..................... H01L 33/42
257/79
(Continued)

FOREIGN PATENT DOCUMENTS

JP          2011176001 A      9/2011
KR     1020120116257 A     10/2012
(Continued)

OTHER PUBLICATIONS

Park, H.L., Authorized Officer, Korean Intellectual Property Office, Written Opinion, International Application No. PCT/KR2015/008840, dated Dec. 8, 2015, 4 pages.

*Primary Examiner* — William Coleman
*Assistant Examiner* — Kien Ly
(74) *Attorney, Agent, or Firm* — Perkins Coie LLP

(57) ABSTRACT

A light emitting diode includes an n-type semiconductor layer disposed on a substrate; a p-type semiconductor layer disposed on a portion of the n-type semiconductor layer; an active layer disposed between the n-type semiconductor layer and the p-type semiconductor layer and generating light through recombination of electrons and holes; an ohmic contact layer disposed on the p-type semiconductor layer and including an indium tin oxide (ITO) layer doped with a metal, a transparent conductive layer disposed on the ohmic contact layer to a different thickness than the ohmic contact layer and including an undoped ITO layer, and a reflective layer disposed on the transparent conductive layer and including an oxide layer. Accordingly, the light emitting diode exhibits excellent current-voltage characteristics through improvement in reliability and electrical conductivity of the ohmic contact layer while improving luminous efficacy through the reflective layer formed of an oxide.

18 Claims, 19 Drawing Sheets

(51) Int. Cl.
  *H01L 33/40* (2010.01)
  *H01L 33/46* (2010.01)

(56) References Cited

U.S. PATENT DOCUMENTS

| | | | |
|---|---|---|---|
| 2007/0126021 A1* | 6/2007 | Ryu | B82Y 20/00 |
| | | | 257/103 |
| 2009/0283787 A1* | 11/2009 | Donofrio | H01L 33/405 |
| | | | 257/98 |
| 2010/0133529 A1* | 6/2010 | Taraschi | G03B 21/28 |
| | | | 257/43 |
| 2010/0163910 A1 | 7/2010 | Bougrov et al. | |
| 2012/0012884 A1* | 1/2012 | Muramoto | H01L 33/42 |
| | | | 257/99 |
| 2013/0234192 A1* | 9/2013 | Kim | H01L 33/38 |
| | | | 257/98 |
| 2014/0175452 A1* | 6/2014 | Richardson | H01L 33/42 |
| | | | 257/76 |
| 2014/0225143 A1* | 8/2014 | Kususe | H01L 33/62 |
| | | | 257/98 |
| 2015/0228850 A1* | 8/2015 | Zheng | H01L 33/40 |
| | | | 257/13 |
| 2016/0118535 A1* | 4/2016 | Lunev | H01L 33/06 |
| | | | 257/13 |
| 2016/0260869 A1* | 9/2016 | Jeon | H01L 33/38 |

FOREIGN PATENT DOCUMENTS

| | | |
|---|---|---|
| KR | 1020140089886 A | 7/2014 |
| WO | 2013046419 A1 | 4/2013 |

\* cited by examiner

LIGHT EMITTING DIODE AND METHOD OF FABRICATING THE SAME

This application is a continuation application, under 35 U.S.C. §120, of the PCT Application No. PCT/KR2015/008840 filed on Aug. 24, 2015, which further claims priorities to Korean Application No. 10-2014-0112387 filed on Aug. 27, 2014 and Korean Application No. 10-2015-0116046 filed on Aug. 18, 2015. The disclosures of the above referenced applications are incorporated by reference as part of this application.

TECHNICAL FIELD

Exemplary embodiments relate to a light emitting diode and a method of fabricating the same, and more particularly, to a light emitting diode having improved electrical conductivity and reliability, and a method of fabricating the same.

BACKGROUND

A light emitting diode (LED) refers to a device that emits light through recombination of carriers (electrons or holes) in a p-n junction structure of semiconductors and can realize a variety of colors using various compound semiconductors such as GaAs, AlGaAs, GaN, InGaN, AlGaInP, and the like.

Such light emitting diodes are operated at lower power and have longer lifespan than typical light bulbs or fluorescent lamps, can be installed in a narrow space, and are invulnerable to vibration. In addition, the light emitting diodes are used in a display device and a backlight unit and have expanded their application to general lighting apparatus, large LCD-TV backlight units, automobile headlights, and general luminaires due to good characteristics thereof in terms of reduction in power consumption and durability.

However, in order to achieve application of light emitting diodes to various fields, typical light emitting diodes are required to have improved luminous efficacy, to solve a problem of heat dissipation, and to achieve high brightness and high output. Recently, in order to address such problems, semiconductor light emitting diodes have attracted increasing attention.

SUMMARY

Exemplary embodiments provide a light emitting diode having improved electrical conductivity and reliability.

Exemplary embodiments provide a method of fabricating a light emitting diode having improved electrical conductivity and reliability.

In accordance with one aspect, a light emitting diode includes: an n-type semiconductor layer disposed on a substrate, a p-type semiconductor layer disposed on a portion of the n-type semiconductor layer, an active layer disposed between the n-type semiconductor layer and the p-type semiconductor layer and generating light through recombination of electrons and holes, an ohmic contact layer disposed on the p-type semiconductor layer and including an indium tin oxide (ITO) layer doped with a metal, a transparent conductive layer disposed on the ohmic contact layer to a different thickness than the ohmic contact layer and including an undoped ITO layer, and a reflective layer disposed on the transparent conductive layer and including an oxide layer.

In accordance with another aspect, a light emitting diode includes: a light emitting structure including a first conductive type semiconductor layer, a second conductive type semiconductor layer disposed on the first conductive type semiconductor layer, and an active layer interposed between the first and second conductive type semiconductor layers, and having at least one hole formed through the second conductive type semiconductor layer and the active layer to expose the first conductive type semiconductor layer therethrough, a first electrode forming ohmic contact with the first conductive type semiconductor layer through the at least one hole of the light emitting structure; a current spreading layer disposed on the second conductive type semiconductor layer and forming ohmic contact with the second conductive type semiconductor layer, and including a lower current spreading layer and an upper current spreading layer disposed on the lower current spreading layer, a second electrode disposed on the current spreading layer; an insulation layer covering the light emitting structure and the current spreading layer, and including openings partially exposing the first and second electrodes; and a first pad and a second pad disposed on the insulation layer and electrically connected to the first and second electrodes, respectively, wherein the upper current spreading layer and the lower current spreading layer have different electrical conductivities, and wherein the at least one hole includes a first hole disposed under the first pad; and a second hole including a portion disposed under the first pad and a portion disposed under a gap between the first and second pads.

According to exemplary embodiments, a p-type ohmic contact layer of a light emitting diode is formed of ITO to improve ohmic contact characteristics and transparency, thereby improving efficiency of the light emitting diode. In addition, the light emitting diode according to the exemplary embodiments allows thin deposition of ITO, thereby stabilizing a device fabrication process. Furthermore, ITO is doped with a metal such as silver (Ag), thereby improving not only electrical conductivity but also current spreading efficiency and operation voltage characteristics. Furthermore, the light emitting diode includes an undoped transparent conductive layer on the ohmic contact layer, thereby improving current spreading efficiency and light transmittance while forming the ohmic contact layer as thin as possible.

In some exemplary embodiments, the light emitting diode includes a distributed Bragg reflector (DBR) formed as a reflective layer using two or more oxide layers having a great difference in index of refraction to reflect light at any wavelength, thereby improving reflectivity. Accordingly, the exemplary embodiments can provide a light emitting diode having improved reliability.

In some exemplary embodiments, the light emitting diode includes electrodes, which include extended portions extending to a region between first and second pads, thereby improving current spreading efficiency.

In some exemplary embodiments, the light emitting diode employs a current spreading layer of a multilayer structure, thereby improving current spreading efficiency and luminous efficacy.

BRIEF DESCRIPTIONS OF DRAWINGS

DETAILED DESCRIPTION

Figure 1:
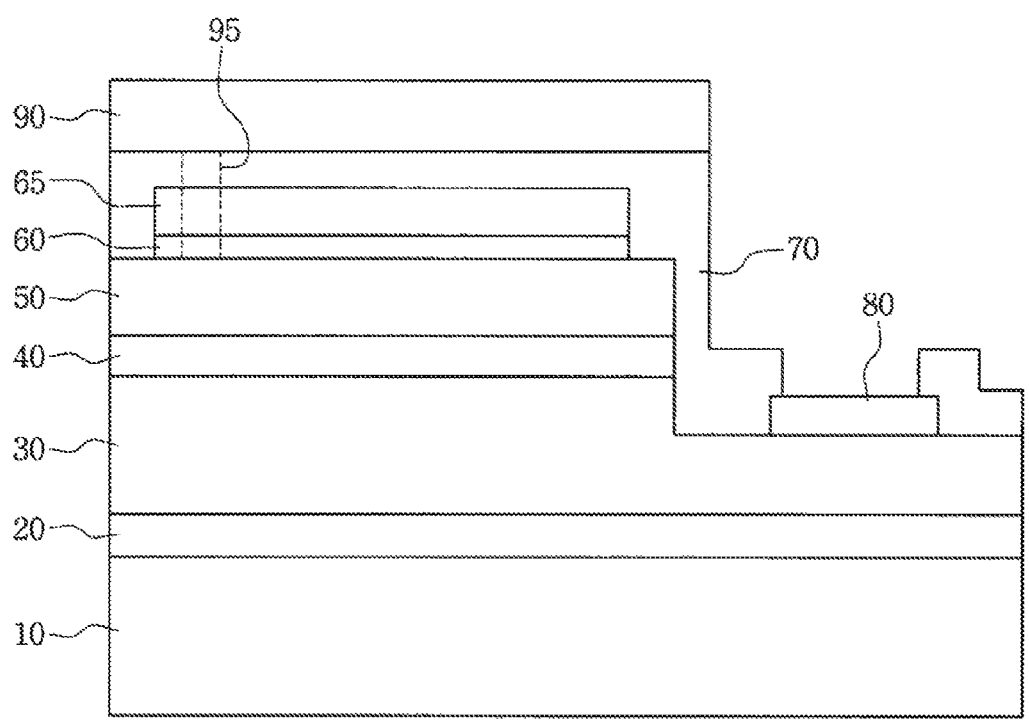
FIG. 1 is a sectional view of a light emitting diode according to some exemplary embodiments.

A typical light emitting diode is fabricated by sequentially stacking an n-type semiconductor layer, an active layer, a p-type semiconductor layer, and a reflective layer on a substrate. In such a structure of the light emitting diode, since the reflective layer is formed of a highly reflective material, for example, silver (Ag), silver oxide (Ag$_2$O), or aluminum (Al), which has difficulty in formation of ohmic contact, such a light emitting diode has problems such as operation instability and reduced lifespan caused by heat generation resulting from high operation voltage. Therefore, various attempts have been made to form an ohmic contact layer capable of securing high reflectivity while exhibiting low specific contact resistance.

In accordance with some aspects described herein, a light emitting diode includes: an n-type semiconductor layer disposed on a substrate; a p-type semiconductor layer disposed on a portion of the n-type semiconductor layer; an active layer disposed between the n-type semiconductor layer and the p-type semiconductor layer and generating light through recombination of electrons and holes; an ohmic contact layer disposed on the p-type semiconductor layer and including an indium tin oxide (ITO) layer doped with a metal; a transparent conductive layer disposed on the ohmic contact layer to a different thickness than the ohmic contact layer and including an undoped ITO layer; and a reflective layer disposed on the transparent conductive layer and including an oxide layer.

In some exemplary embodiments, the ohmic contact layer can be doped with at least one metal selected from among silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd).

In some exemplary embodiments, the transparent conductive layer can be an ITO layer having a greater thickness than the ohmic contact layer.

In some exemplary embodiments, the reflective layer can be formed of a non-conductive material.

In some exemplary embodiments, the reflective layer can include at least one conductive material selected from among silver (Ag), indium (In), tin (Sn), zinc (Zn), cadmium (Cd), gallium (Ga), aluminum (Al), magnesium (Mg), titanium (Ti), tantalum (Ta), molybdenum (Mo), nickel (Ni), copper (Cu), gold (Au), platinum (Pt), rhodium (Rh), iridium (Ir), ruthenium (Ru), and palladium (Pd).

In some exemplary embodiments, the reflective layer can form a distributed Bragg reflector (DBR).

In some exemplary embodiments, the distributed Bragg reflector can include a first oxide layer including silicon oxide (SiOx); and a second oxide layer including titanium oxide (TiOx).

In some exemplary embodiments, the reflective layer can further include a dielectric layer disposed on the ohmic contact layer.

In some exemplary embodiments, the reflective layer can include a plurality of oxide layers having different indexes of refraction.

In some exemplary embodiments, the reflective layer can include a first oxide layer; and a second oxide layer having a different index of refraction than the first oxide layer.

In accordance with other aspects described herein, a light emitting diode includes: a light emitting structure including a first conductive type semiconductor layer, a second conductive type semiconductor layer disposed on the first conductive type semiconductor layer, and an active layer interposed between the first and second conductive type semiconductor layers, and having at least one hole formed through the second conductive type semiconductor layer and the active layer to expose the first conductive type semiconductor layer therethrough; a first electrode forming ohmic contact with the first conductive type semiconductor layer through the at least one hole of the light emitting structure; a current spreading layer disposed on the second conductive type semiconductor layer and forming ohmic contact with the second conductive type semiconductor layer, and including a lower current spreading layer and an upper current spreading layer disposed on the lower current spreading layer; a second electrode disposed on the current spreading layer; an insulation layer covering the light emitting structure and the current spreading layer, and including openings partially exposing the first and second electrodes; and a first pad and a second pad disposed on the insulation layer and electrically connected to the first and second electrodes, respectively, wherein the upper current spreading layer and the lower current spreading layer have different electrical conductivities, and wherein the at least one hole includes a first hole disposed under the first pad; and a second hole including a portion disposed under the first pad and a portion disposed under a gap between the first and second pads.

The light emitting diode can further include a current blocking layer disposed under the current spreading layer, and the current blocking layer can be disposed at a location corresponding to the second electrode under the second electrode.

The upper current spreading layer can have a lower electrical conductivity than the lower current spreading layer.

The first electrode can include a first ohmic contact electrode disposed under the first pad and forming ohmic contact with the first conductive type semiconductor layer through the first hole; and a second ohmic contact electrode including a main electrode disposed under the first pad, and an extension electrode extending from the main electrode to a portion under a region between the first pad and the second pad, the second ohmic contact electrode forming ohmic contact with the first conductive type semiconductor layer through the second hole.

The extension electrode of the second ohmic contact electrode can further extend to a region under the second pad.

The extension electrode of the second ohmic contact electrode can be covered by the insulation layer.

The second electrode can include a first connection electrode disposed under the second pad; and a second connection electrode including a main electrode disposed under the second pad and an extension electrode extending from the main electrode to a portion under a region between the first pad and the second pad.

The extension electrode of the second connection electrode can further extend to a region under the first pad.

The insulation layer can include a lower insulation layer; and an upper insulation layer disposed on the lower insulation layer.

The lower insulation layer can have a greater thickness than the upper insulation layer, and the upper insulation layer can include a distributed Bragg reflector.

The current spreading layer can include a conductive oxide doped with a metal dopant.

The current spreading layer can include a transparent conductive oxide doped with at least one of Ga, Al and In.

The upper current spreading layer and the lower current spreading layer can have different indexes of refraction.

The upper insulation layer can include at least two distributed Bragg reflectors reflecting light in different wavelength bands.

In the following detailed description, reference is made to the accompanying drawings that show, by way of illustration, specific exemplary embodiments in which the disclosed technology can be practiced. These exemplary embodiments are described in sufficient detail to enable those skilled in the art to practice the disclosed technology. It should be understood that the following exemplary embodiments, although different, are not necessarily mutually exclusive. For example, a particular feature, structure, or characteristic described herein, in connection with one exemplary embodiment, can be implemented within other embodiments without departing from the spirit and scope of the present document. In addition, it should be understood that the location or arrangement of individual elements within each disclosed embodiment can be modified without departing from the spirit and scope of the present document. The following detailed description is, therefore, not to be taken in a limiting sense, and the scope of the present document is defined only by the appended claims, appropriately interpreted, along with the full range of equivalents to which the claims are entitled. In the drawings, like reference numerals refer to the same or similar functionality. The term "exemplary" is used herein to mean "an example of" and does not necessarily refer to the described embodiment as being preferred or ideal.

Hereinafter, exemplary embodiments will be described in more detail with reference to the accompanying drawings.

FIG. 1 is a sectional view of a light emitting diode according to some exemplary embodiments.

In a light emitting diode 1 according to some embodiments, an ohmic contact layer 60 on a p-type semiconductor layer 50 is formed of indium tin oxide (ITO) doped with a metal such as silver (Ag) to improve ohmic contact characteristics and light transmittance while allowing thin deposition through stabilization of a device fabrication process. In addition, since ITO doped with the metal such as silver (Ag) improves current spreading efficiency and operation voltage characteristics, the light emitting diode 1 can have improved reliability and long lifespan. Furthermore, the light emitting diode 1 includes an undoped transparent conductive layer 65 formed on the ohmic contact layer 60, thereby improving current spreading and light permeation while forming the ohmic contact layer 60 as thin as possible.

Furthermore, the light emitting diode 1 includes a distributed Bragg reflector (DBR) formed as a reflective layer 70 using a plurality of oxide layers having a great difference in index of refraction to reflect light at any wavelength (400 to 700 nm). Accordingly, it is possible to improve reflectivity of the reflective layer 70 while improving luminous efficacy of the light emitting diode 1.

Referring to FIG. 1, the light emitting diode 1 according to the exemplary embodiment includes an n-type semiconductor layer 30, an active layer 40, a p-type semiconductor layer 50, an ohmic contact layer 60, a transparent conductive layer 65, and a reflective layer 70 sequentially formed on a substrate 10 in this order. The light emitting diode 1 can further include electrodes 80, 90 and a sub-mount substrate joined to the substrate 10 by flip-chip bonding.

The substrate 10 refers to a typical wafer used in fabrication of the light emitting diode 1, and can be a transparent substrate formed of sapphire ($Al_2O_3$), zinc oxide (ZnO), lithium alumina ($LiAl_2O_3$), and the like.

In some embodiments, the substrate 10 can be a sapphire substrate and can be finally removed from the light emitting diode. In the structure wherein the substrate 10 is removed from the light emitting diode, the electrodes 80, 90 can be disposed on a conductive substrate or the n-type semiconductor layer 30 from which the substrate 10 is removed.

Before formation of the n-type semiconductor layer 30 on the substrate 10, a buffer layer 20 including aluminum nitride (AlN) or gallium nitride (GaN) can be further formed on the substrate in order to reduce lattice mismatch between the n-type semiconductor layer and the sapphire substrate.

The n-type semiconductor layer 30 is an electron generation layer and can be formed of various semiconductor materials, for example, n-type dopant-implanted gallium nitride (GaN), without being limited thereto. In this exemplary embodiment, the n-type semiconductor layer 30 is formed of n-type $Al_xGa_{1-x}N$ ($0 \leq x \leq 1$).

The p-type semiconductor layer 50 is a hole generation layer and can be formed of various semiconductor materials, for example, p-type dopant-implanted gallium nitride (GaN), without being limited thereto. In this exemplary embodiment, the p-type semiconductor layer 50 is formed of p-type $Al_xGa_{1-x}N$ ($0 \leq x \leq 1$).

Alternatively, the n-type semiconductor layer 30 and the p-type semiconductor layer 50 can be formed of indium gallium nitride (InGaN). In other exemplary embodiments, the locations of the n-type semiconductor layer 30 and the p-type semiconductor layer 50 can be interchanged, and each of the n-type semiconductor layer 30 and the p-type semiconductor layer 50 can have a multilayer structure and can include an additional layer.

The active layer 40 is a region in which quantum wells are generated with a band-gap therebetween to allow generation of light through recombination of electrons and holes therein, and can include indium gallium nitride (InGaN). Since wavelengths of light generated through recombination of electrons and holes vary depending upon the kind of material constituting the active layer 40, the semiconductor materials included in the active layer 40 can be adjusted depending upon wavelengths.

In some exemplary embodiments, the active layer 40 can be realized in various ways, such as a single quantum well structure, a multi-quantum well (MQW) structure, a multi-quantum dot/wire structure, a combination of quantum dots/wires and wells, and the like.

Herein, a multilayer structure including the n-type semiconductor layer 30, the active layer 40 and the p-type semiconductor layer 50 stacked one above another will be referred to as a light emitting layer.

The electrodes 80, 90 are composed of an n-type electrode 80 which supplies electrons to the n-type semiconductor layer 30, and a p-type electrode 90 which supplies holes to the p-type semiconductor layer 50. A contact 95 can be formed between the p-type semiconductor layer 50 and the p-type electrode 90 for electrical connection therebetween.

In this exemplary embodiment, the electrodes 80, 90 are deposited to a lower height than a package. In this structure, the electrodes 80, 90 can be coupled to the package (submount substrate) through separate bumps or solders. Alternatively, the electrodes 80, 90 can be formed using metal bumps having a height so as to be coupled to the package.

The p-type electrode 90 can be a conductive reflective layer configured to cover the entirety or substantially the entirety of the reflective layer 70 above the p-type semiconductor layer 50 in order to aid in reflection of light emitted from the active layer 40 towards the substrate 10 or the n-type semiconductor layer 30. In some exemplary embodiments, the p-type electrode 90 can be formed of a metal having high reflectivity, such as aluminum (Al) and gold (Ag). In other exemplary embodiments, the p-type electrode 90 can have a multilayer structure of nickel (Ni)/gold (Au), silver (Ag)/gold (Au), titanium (Ti)/gold (Au), nickel (Ni)/gold (Au), palladium (Pd)/gold (Au), chromium (Cr)/gold (Au), or the like.

The ohmic contact layer 60 is formed of indium tin oxide (ITO) doped with a metal in order to reduce contact resistance of the p-type semiconductor layer 50. The metal with which the ohmic contact layer 60 is doped can include at least one selected from among silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd).

The ohmic contact layer 60 can have a thickness of about 10 Å to 1000 Å. In the ohmic contact layer 60, the metal can be doped in an amount of about 0.01% to about 40%, preferably about 0.01% to about 20%.

In the structure wherein the reflective metal 70 is formed on the ohmic contact layer 60 formed of ITO doped with a metal, ITO can be deposited to a thin thickness, thereby improving ohmic characteristics and transmittance. In addition, since ITO has lower current spreading-resistance than metal upon high output operation, it is possible to improve operation efficiency of the light emitting diode 1 by increasing light output. Furthermore, ITO can be doped with the metal to improve electrical conductivity while improving current spreading efficiency and operation characteristics.

The transparent conductive layer 65 is formed of undoped ITO on the ohmic contact layer 60. The transparent conductive layer 65 has a different thickness than the ohmic contact layer 60, particularly, a greater thickness than the ohmic contact layer 60.

In this exemplary embodiment, the undoped transparent conductive layer 65 is formed on the ohmic contact layer 60 formed of ITO doped with the metal, thereby improving current spreading efficiency and light transmittance while enabling formation of the ohmic contact layer 60 as thin as possible.

The reflective layer 70 is formed on the transparent conductive layer 65 so as to reflect light received from the ohmic contact layer 60 and the transparent conductive layer 65 towards the substrate 10 or the n-type semiconductor layer 30 from which the substrate 10 is removed. The reflective layer 70 can be formed on a region of the n-type semiconductor layer 30 exposed by etching and on a portion of the electrode 80. However, it should be noted that the reflective layer 70 does not necessarily cover the entirety of the semiconductor layers 30, 50 at an opposite side to the substrate 10.

In this exemplary embodiment, the reflective layer 70 can be formed of an oxide instead of a metal. Accordingly, as compared with conventional techniques, bonding strength between the ohmic contact layer 60 and the transparent conductive layer 65 is reinforced, whereby the light emitting diode 1 can secure stable reliability upon operation. In addition, since there is no need for a separate metal layer, it is possible to achieve improvement in luminous efficacy by preventing absorption of light thereby.

The reflective layer 70 can be composed of a plurality of oxide layers having difference indexes of refraction. In some embodiments, the reflective layer 70 can be composed of a first oxide layer and a second oxide layer having a different index of refraction than the first oxide layer. The oxide layers can be formed of a non-conductive or conductive material.

In some embodiments wherein the reflective layer 70 is formed of a conductive material, the reflective layer can include a metal such as silver (Ag), indium (In), tin (Sn), zinc (Zn), cadmium (Cd), gallium (Ga), aluminum (Al), magnesium (Mg), titanium (Ti), tantalum (Ta), molybdenum (Mo), nickel (Ni), copper (Cu), gold (Au), platinum (Pt), rhodium (Rh), iridium (Ir), ruthenium (Ru), and palladium (Pd).

Preferably, the reflective layer 70 is formed of a light transmitting material capable of acting as a reflective layer while preventing absorption of light, for example, an oxide such as silicon oxide (SiOx), titanium oxide (TiOx), tantalum oxide ($Ta_2O_5$), and the like. In one exemplary embodiment wherein the reflective layer 70 is formed of silicon oxide (SiOx), since the reflective layer 70 has a lower index of refraction than the p-type semiconductor layer 50 (for example: GaN), the reflective layer 70 can reflect some light at a critical angle or more towards the light emitting structure 30, 40, 50.

On the other hand, in the structure wherein the reflective layer 70 is composed of a distributed Bragg reflector (DBR), the reflective layer 70 can improve luminous efficacy by reflecting a larger amount of light towards the light emitting structure 30, 40, 50.

That is, the reflective layer 70 can be composed of a plurality of oxide layers having different indexes of refraction to reflect light at any wavelength of 400 nm to 70 nm. For example, the distributed Bragg reflector (DBR) can include a first oxide layer including silicon oxide ($SiO_2$) and a second oxide layer including titanium oxide ($TiO_2$).

In this exemplary embodiment, since the p-type ohmic contact layer is formed of ITO, the p-type ohmic contact layer can improve ohmic contact characteristics and transmittance, and can be deposited to a thin thickness through stabilization of a device fabrication process. Furthermore, ITO is doped with a metal such as silver (Ag) to improve electrical conductivity, and current spreading efficiency and operation voltage characteristics of the light emitting diode can be improved through ITO. Furthermore, the reflective layer is composed of the distributed Bragg reflector (DBR) using at least two oxides having a great difference in index of refraction therebetween to reflect light at any wavelength (400 nm to 700 nm), thereby improving reflectivity while replacing a typical metal-based reflective layer.

Figure 2:
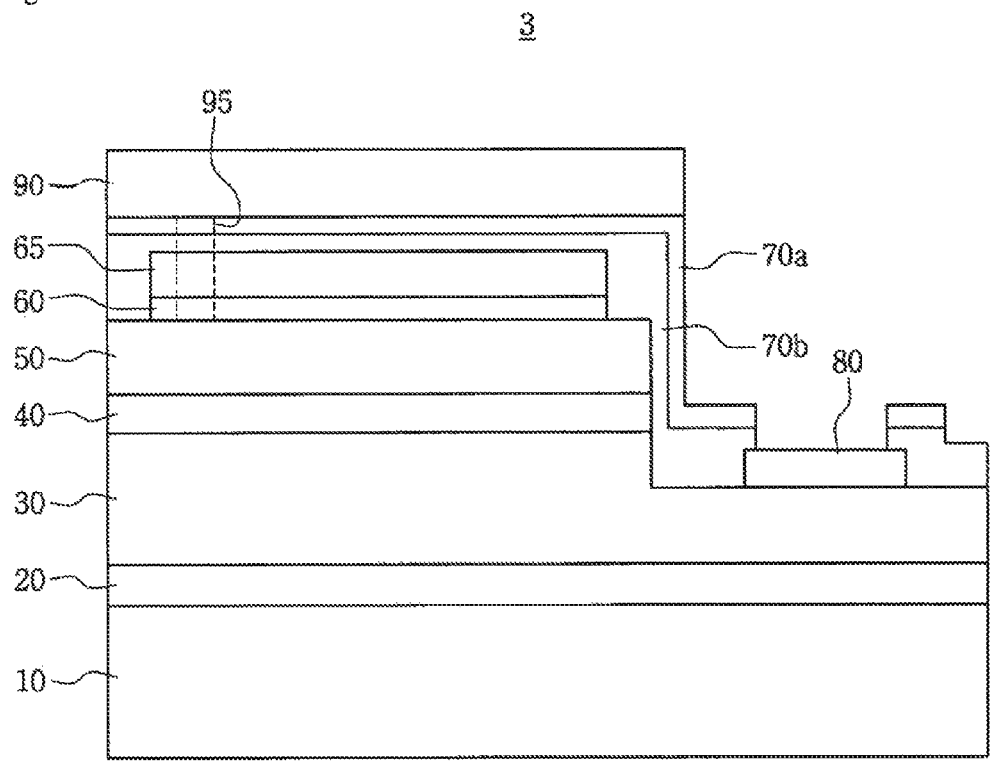
FIG. 2 is a sectional view of a light emitting diode according to some other exemplary embodiments.

FIG. 2 is a sectional view of a light emitting diode according to another exemplary embodiment.

A light emitting diode 3 according to this exemplary embodiment has substantially the same configuration as the light emitting diode 1 of FIG. 1 except for the reflective layer. Accordingly, the same components as those of the light emitting diode 1 of FIG. 1 will be denoted by the same reference numerals, and repeated description thereof will be omitted.

Referring to FIG. 2, the light emitting diode 3 includes a reflective layer 70a, 70b that has a bilayer structure, which includes a distributed Bragg reflector 70a and a dielectric layer 70b having a lower index of refraction than the p-type semiconductor layer 50.

Before deposition of the distributed Bragg reflector 70a requiring accuracy, the dielectric layer 70b is formed to a certain thickness, so that the distributed Bragg reflector 70a can be stably formed, irrespective of deposited layers 50, 60, 80, 90 formed of different materials on the light emitting structure 30, 40, 50 and having different shapes, while improving reflection of light. For example, the dielectric layer 70b can be formed of silicon oxide ($SiO_2$) and can have a thickness of about 0.2 μm to 1.0 μm.

For the distributed Bragg reflector 70a composed of a combination of titanium oxide ($TiO_2$)/silicon oxide ($SiO_2$) layers, each of the layers is designed to have an optical thickness of ¼ of a predetermined wavelength, and the combination can include 4 to 20 pairs of layers. An excessively thin thickness of the distributed Bragg reflector can cause increase in operation voltage.

In this exemplary embodiment, since the p-type ohmic contact layer is formed of ITO, the p-type ohmic contact layer can improve ohmic contact characteristics and transmittance, and can be deposited to a thin thickness through stabilization of a device fabrication process. Furthermore, the dielectric layer is formed under the distributed Bragg reflector, thereby securing a more stable fabrication process while improving reliability of the fabricated light emitting diode.

The present technology can be applied not only to the flip-chip light emitting diodes as shown in FIG. 1 and FIG. 2, but also to other types of flip-chip type light emitting diode, so long as the light emitting diode includes the ohmic contact layer and the reflective layer. Furthermore, the disclosed technology can also be applied to any types of light emitting diodes including a top-emitting light emitting diode (TELED), vertical LED (VLED), and the like, without being limited to the flip-chip type light emitting diodes.

FIG. 3a to FIG. 3g are side sectional views illustrating a method of fabricating a light emitting diode according to some embodiments.

In description of the method of fabricating a light emitting diode according to the exemplary embodiments, the same components as those of the light emitting diode 1 of FIG. 1 and FIG. 2 will be denoted by the same reference numerals, and repeated descriptions thereof will be omitted.

The method, according to some embodiments, provides a light emitting diode which includes a plurality of light emitting cells connected to each other in series, in parallel or in series-parallel at a wafer level to reduce the size thereof and can be operated by alternating current and at suitable voltage and current so as to be used in a lighting apparatus.

Figure 3A:
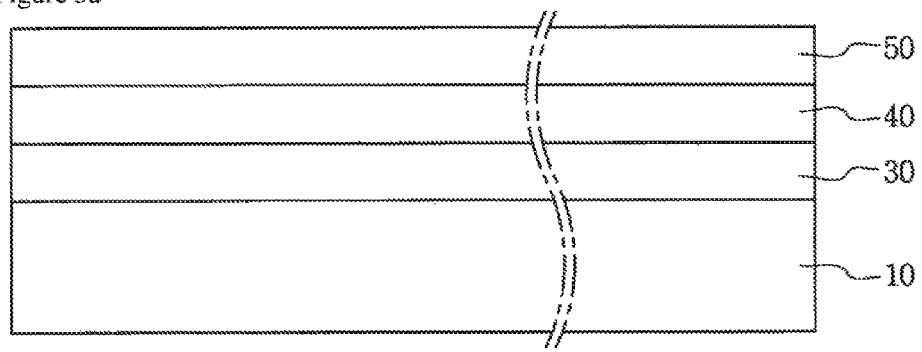
FIG. 3a to FIG. 3g are side sectional views illustrating a method of fabricating a light emitting diode.

Referring to FIG. 3a, a light emitting structure, that is, an n-type semiconductor layer 30, an active layer 40 and a p-type semiconductor layer 50 are sequentially formed on a substrate 10.

The substrate 10 refers to a typical wafer used in fabrication of the light emitting diode, and can be a transparent substrate formed of sapphire ($Al_2O_3$), zinc oxide (ZnO), lithium alumina ($LiAl_2O_3$), and the like. In one exemplary embodiment, the substrate 10 can be a sapphire substrate and can be finally removed from the light emitting diode.

In another exemplary embodiment, before formation of the n-type semiconductor layer 30 on the substrate 10, a buffer layer 20 including AN or GaN can be further formed on the substrate in order to reduce lattice mismatch between the n-type semiconductor layer and the sapphire substrate.

The n-type semiconductor layer 30 is an electron generation layer and can be formed of various semiconductor materials, for example, n-type dopant-implanted gallium nitride (GaN), without being limited thereto. In this exemplary embodiment, the n-type semiconductor layer 30 is formed of n-type $Al_xGa_{1-x}N$ (0≤x≤1).

The p-type semiconductor layer 50 is a hole generation layer and can be formed of various semiconductor materials, for example, p-type dopant-implanted gallium nitride (GaN), without being limited thereto. In this exemplary embodiment, the p-type semiconductor layer 50 is formed of p-type $Al_xGa_{1-x}N$ (0≤x≤1).

Alternatively, the n-type semiconductor layer 30 and the p-type semiconductor layer 50 can be formed of indium gallium nitride (InGaN). In other exemplary embodiments, the locations of the n-type semiconductor layer 30 and the p-type semiconductor layer 50 can be interchanged, and each of the n-type semiconductor layer 30 and the p-type semiconductor layer 50 can have a multilayer structure and can include an additional layer.

The active layer 40 is a region in which quantum wells are generated with a band-gap therebetween to allow generation of light through recombination of electrons and holes therein, and can include indium gallium nitride (InGaN). Since wavelengths of light generated through recombination of electrons and holes vary depending upon the kind of material constituting the active layer 40, the semiconductor materials included in the active layer 40 can be adjusted depending upon desired wavelengths.

The above-described material layers can be formed through various deposition and growth methods including metal organic chemical vapor deposition (MOCVD), chemical vapor deposition (CVD), plasma-enhanced chemical vapor deposition (PCVD), molecular beam epitaxy (MBE), hydride vapor phase epitaxy (HVPE), and the like.

Figure 3B:
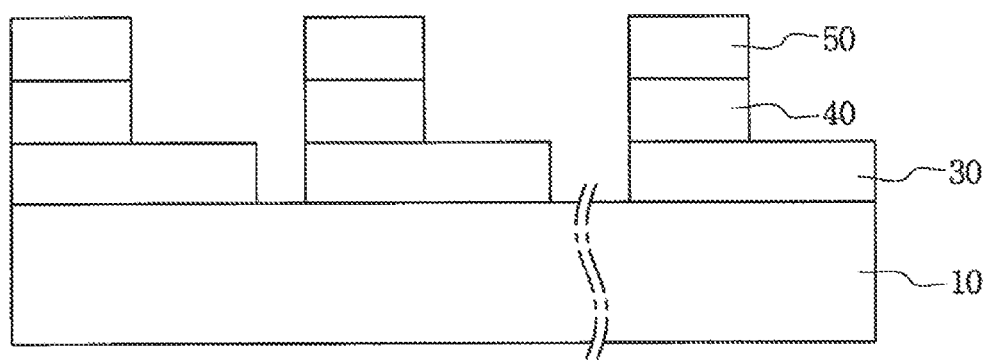

Then, as shown in FIG. 3b, the p-type semiconductor layer 50, the active layer 40 and the n-type semiconductor layer 30 are partially removed to divide light emitting cells from each other. To this end, a predetermined mask pattern can be formed on the p-type semiconductor layer 50, followed by etching some regions of the p-type semiconductor layer 50, the active layer 40 and the n-type semiconductor layer 30 exposed through the mask pattern, thereby electrically dividing the plurality of light emitting cells from each other.

In addition, the p-type semiconductor layer 50 and the active layer 40 are partially removed by etching to expose a portion of the n-type semiconductor layer 30. For example, a predetermined etching mask pattern is formed on the p-type semiconductor layer 50, and the p-type semiconductor layer 50 and the active layer 40 are removed by dry/wet etching to expose the n-type semiconductor layer 30.

It should be understood that the fabrication method is not limited to the above process and can be modified in various ways for convenience. For example, first, the p-type semiconductor layer 50 and the active layer 40 can be partially removed by etching to expose a portion of the n-type semiconductor layer 30, and a predetermined exposed region of the n-type semiconductor layer 30 can be removed to expose the substrate 10 in order to form a plurality of light emitting cells on the substrate 10.

Figure 3C:
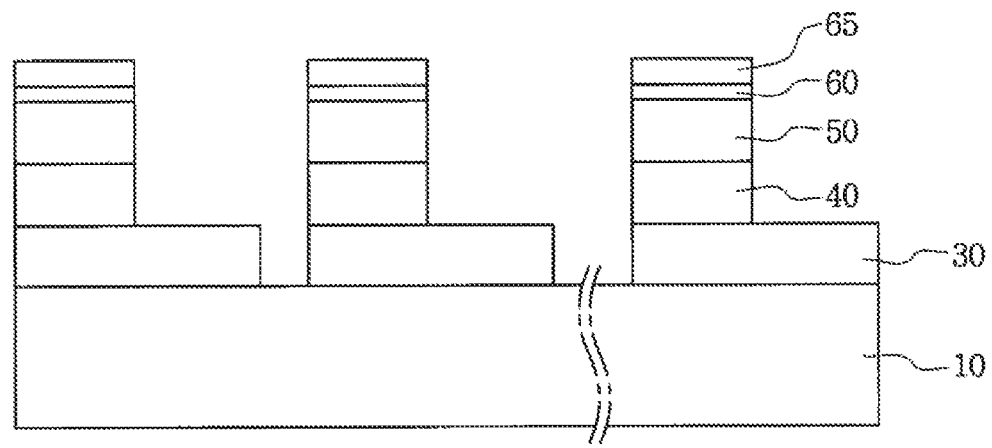

As shown in FIG. 3c, an ohmic contact layer 60 and a transparent conductive layer 65 are formed on the p-type semiconductor layer 50 in order to reduce contact resistance of the p-type semiconductor layer 50, in which the ohmic contact layer 60 is formed of a metal-doped indium tin oxide (ITO) and the transparent conductive layer 65 is formed of undoped ITO.

In order to form the ohmic contact layer 60, first, indium tin oxide (ITO) is deposited on the p-type semiconductor layer 50. ITO can be obtained in the form of a transparent conductive layer by processing with a sputtering target, by spraying dissolved ITO, or by dipping the substrate in a solution. Alternatively, a transparent conductive film obtained by coating ITO onto a polyethylene film or the like can be attached to the substrate, or various other methods can be used, as desired.

ITO can be formed to a thickness of about 10 Å to 1000 Å. After deposition of ITO, ITO is doped with a metal. The metal can include at least one selected from among silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd). The metal can be doped in an amount of about 0.01% to about 40%, preferably about 0.01% to about 20%.

The transparent conductive layer 65 is formed on the ohmic contact layer 60 by depositing ITO onto the ohmic contact layer 60. Here, the transparent conductive layer 65 is formed of undoped ITO. The transparent conductive layer 65 can be deposited to have a different thickness than the ohmic contact layer 60, and can be deposited to a greater thickness than the ohmic contact layer 60.

In this exemplary embodiment, the undoped transparent conductive layer 65 is formed on the ohmic contact layer 60 formed of the metal-doped ITO, thereby improving current spreading efficiency and light transmittance while forming the ohmic contact layer 60 as thin as possible.

Figure 3D:
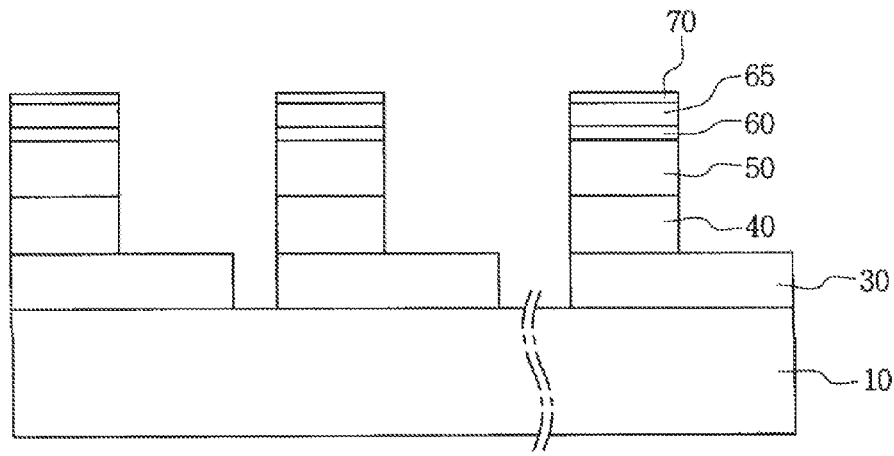

Referring to FIG. 3d, a reflective layer 70 is formed on the transparent conductive layer 65. The reflective layer 70 is formed of an oxide instead of a metal. The oxide can be a non-conductive or conductive material.

In embodiments wherein the reflective layer 70 is formed of a conductive material, the reflective layer can include a metal such as, silver (Ag), indium (In), tin (Sn), zinc (Zn), cadmium (Cd), gallium (Ga), aluminum (Al), magnesium (Mg), titanium (Ti), tantalum (Ta), molybdenum (Mo), nickel (Ni), copper (Cu), gold (Au), platinum (Pt), rhodium (Rh), iridium (Ir), ruthenium (Ru), and palladium (Pd).

As described above, in the structure wherein the reflective layer 70 is formed on the ohmic contact layer 60 formed of ITO doped with a metal such as silver (Ag) and the transparent conductive layer 65 formed of undoped ITO, the ohmic contact layer 60 can be easily deposited to a thin thickness, thereby improving ohmic characteristics and transmittance. Furthermore, the ohmic contact layer 60 is doped with the metal such as silver (Ag), thereby improving electrical conductivity, current spreading efficiency, and operation characteristics.

Accordingly, as compared with conventional techniques, bonding strength between ohmic contact layer 60, the transparent conductive layer 65 and the reflective layer 70 is reinforced, whereby the light emitting diode 1 can secure stable reliability upon operation. In addition, since there is no need for a separate metal layer, it is possible to achieve improvement in luminous efficacy by preventing absorption of light thereby.

The reflective layer 70 can be composed of a plurality of oxide layers having difference indexes of refraction. In one exemplary embodiment, the reflective layer 70 can be composed of a first oxide layer and a second oxide layer having a different index of refraction than the first oxide layer.

The reflective layer 70 can be formed of a light transmitting material capable of acting as a reflective layer while preventing absorption of light, for example, an oxide such as silicon oxide (SiOx), titanium oxide (TiOx), tantalum oxide ($Ta_2O_5$), and the like. In the structure wherein the reflective layer 70 is formed of silicon oxide (SiOx), since the reflective layer 70 has a lower index of refraction than the p-type semiconductor layer 50 (for example: GaN), the reflective layer 70 can reflect some light at a critical angle or more towards the light emitting structure 30, 40, 50.

On the other hand, in the structure wherein the reflective layer 70 is composed of a distributed Bragg reflector (DBR), the reflective layer 70 can improve luminous efficacy by reflecting a greater amount of light towards the light emitting structure 30, 40, 50.

The reflective layer 70 can be composed of a plurality of oxide layers having different indexes of refraction to reflect light at any wavelength of 400 nm to 70 nm. For example, the distributed Bragg reflector (DBR) can include a first oxide layer including silicon oxide ($SiO_2$) and a second oxide layer including titanium oxide ($TiO_2$).

For example, the reflective layer 70 can be formed by deposition at a temperature of 20° C. to 1500° C. and at atmospheric pressure or at a pressure of 10 Torr to 12 Torr in a deposition chamber. Furthermore, after formation of the reflective layer 70, the reflective layer can be subjected to annealing. For example, heat treatment can be performed under conditions of a reactor temperature of 100° C. to 800° C. in a vacuum or gas atmosphere for 10 seconds to 3 hours. Upon heat treatment, at least one gas selected from among nitrogen, argon, helium, oxygen, hydrogen, and air can be supplied into the reactor.

The reflective layer 70 is formed on the p-type semiconductor layer 50 so as to reflect light emitted from the active layer 40 towards the substrate 10 used for growth of semiconductor layers, or towards the n-type semiconductor layer 30 from which the substrate 10 is removed.

The reflective layer 70 can be formed on a region of the n-type semiconductor layer 30 exposed by etching and on a portion of the electrode 80. However, it should be noted that the reflective layer 70 does not necessarily cover the entirety of the semiconductor layers 30, 50 at an opposite side to the substrate 10.

In another exemplary embodiment, as in the light emitting diode 3 of FIG. 2, the reflective layer can have a bilayer structure that includes a distributed Bragg reflector 70a and a dielectric layer 70b having a lower index of refraction than the p-type semiconductor layer 50. In this structure, the dielectric layer 70b can be formed of silicon oxide ($SiO_2$) and can be deposited to a thickness of about 0.2 μm to 1.0 μm.

For the distributed Bragg reflector 70a composed of a combination of titanium oxide ($TiO_2$)/silicon oxide ($SiO_2$) layers, each of the layers is designed to have an optical thickness of a quarter of a predetermined wavelength, and the combination can include 4 to 20 pairs of layers.

Thereafter, the n-type semiconductor layer 30 and the p-type semiconductor layer 50 of two adjacent light emitting cells are connected to each other through an interconnection process. Specifically, the exposed n-type semiconductor layer 30 of one light emitting cell is connected to the p-type semiconductor layer 50 of another light emitting cell adjacent to the one light emitting cell via an interconnection line 85. Here, a conductive interconnection line 85 is formed to electrically connect the n-type semiconductor layer 30 to the p-type semiconductor layer 50 between two adjacent light emitting cells through a process such as a bridge process or a step cover process.

The bridge process can also be referred to as an air-bridge process, and includes forming a photosensitive layer pattern using a photolithography process through coating and development of a photosensitive solution on a region between chips to be connected, forming a thin film using a material such as metal through vacuum deposition, and depositing a conductive material including gold to a predetermined thickness through electroplating, electroless-plating or metal deposition. Thereafter, the photosensitive layer pattern is removed by a solvent, whereby a portion under the conductive material is completely removed and the conductive material remains in the form of a bridge.

In addition, the step cover process includes coating a photosensitive solution on a region between chips to be connected using a photolithography process, developing the photosensitive solution such that some portions are covered by a photosensitive layer pattern except for portions to be connected, followed by coating a conductive material including gold to a predetermined thickness thereon through electroplating, electroless-plating or metal deposition. Thereafter, the photosensitive layer pattern is removed by a solvent, whereby a portion under the conductive material remains to electrically connect the chips to each other and other portions excluding the portion under the conductive material are completely removed.

The interconnection line 85 can be formed of any conductive material including a metal. For example, the interconnection line 85 can be formed of gold (Au), silver (Ag), nickel (Ni), chromium (Cr), platinum (Pt), palladium (Pd), titanium (Ti), tungsten (W), tantalum (Ta) or alloys thereof.

A p-type metal bump 90 and an n-type metal bump 80 are formed on the p-type semiconductor layer 50 at one edge of a light emitting cell and on the n-type semiconductor layer 30 at the other edge of the light emitting cell, respectively. The p-type and n-type metal bumps 80, 90 can be formed of at least one selected from the group consisting of palladium (Pd), tin (Sn), gold (Au), germanium (Ge), copper (Cu), bismuth (Bi), cadmium (Cd), zinc (Zn), silver (Ag), nickel (Ni), titanium (Ti), and alloys thereof.

In another exemplary embodiment, the metal bumps 80, 90 are deposited to a lower height to form electrodes, and separate bumps or solders can be further formed thereon.

Figure 3E:
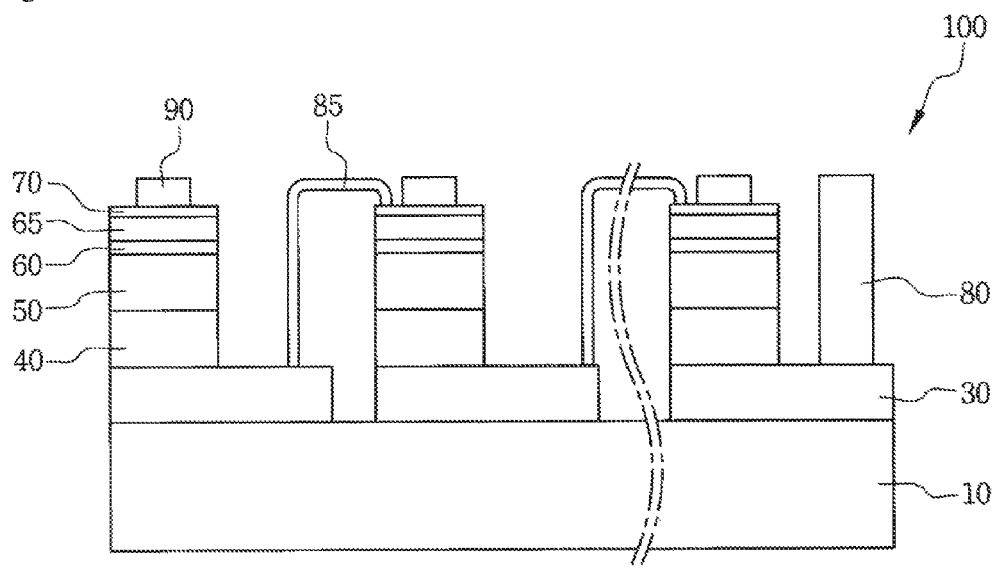

As a result, a light emitting cell block 100 including a plurality of light emitting cells electrically connected to each other through the conductive interconnection line 85 is formed as shown in FIG. 3e. The process of fabricating such a light emitting cell block 100 is not limited to the above process, and can be modified in various ways and various material layers can be further added.

For example, as shown in FIG. 3e, the n-type semiconductor layer 30, the active layer 40 and the p-type semiconductor layer 50 are formed on the substrate 10, and the ohmic contact layer 60, the transparent conductive layer 65 and the reflective layer 70 are formed thereon, followed by etching for isolation between the light emitting cells and for exposing the n-type semiconductor layer 30. In addition, a separate ohmic metal layer including chromium (Cr), gold (Au), and the like can be further formed on the exposed n-type semiconductor layer 30 in order to allow efficient supply of electric current.

Figure 3F:
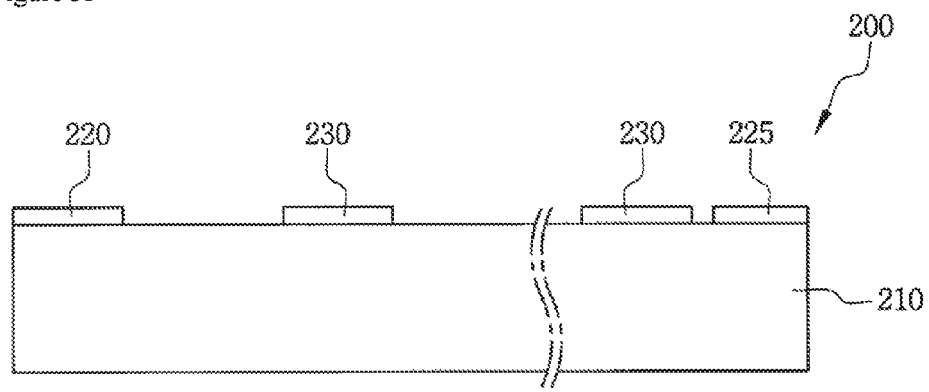

Next, as shown in FIG. 3f, a sub-mount substrate 200 is prepared. The sub-mount substrate 200 includes a substrate 210, a plurality of bonding layers 230 formed on the substrate, a p-type bonding pad 220 disposed at one edge of the substrate 210, and an n-type bonding pad 225 disposed at the other edge thereof.

The substrate 210 can be a silicon carbide (SiC) substrate, a silicon (Si) substrate, a germanium (Ge) substrate, a silicon germanium (SiGe) substrate, an aluminum nitride (AlN) substrate, a metal substrate, or the like, which has good thermal conductivity. In this exemplary embodiment, the substrate can be an aluminum nitride (AlN) substrate, which has good thermal conductivity while exhibiting insulation properties. Obviously, the substrate is not limited thereto and can be formed of a metallic material having high thermal conductivity and high electrical conductivity. The bonding layers 230, the n-type bonding pad 225 and the p-type bonding pad 220 are formed of a metal having good electrical conductivity. These can be formed by screen printing or deposition using a predetermined mask pattern.

Thereafter, a light emitting diode is fabricated by connecting the sub-mount substrate 200 to the aforementioned light emitting cell block 100 via flip-chip bonding.

Figure 3G:
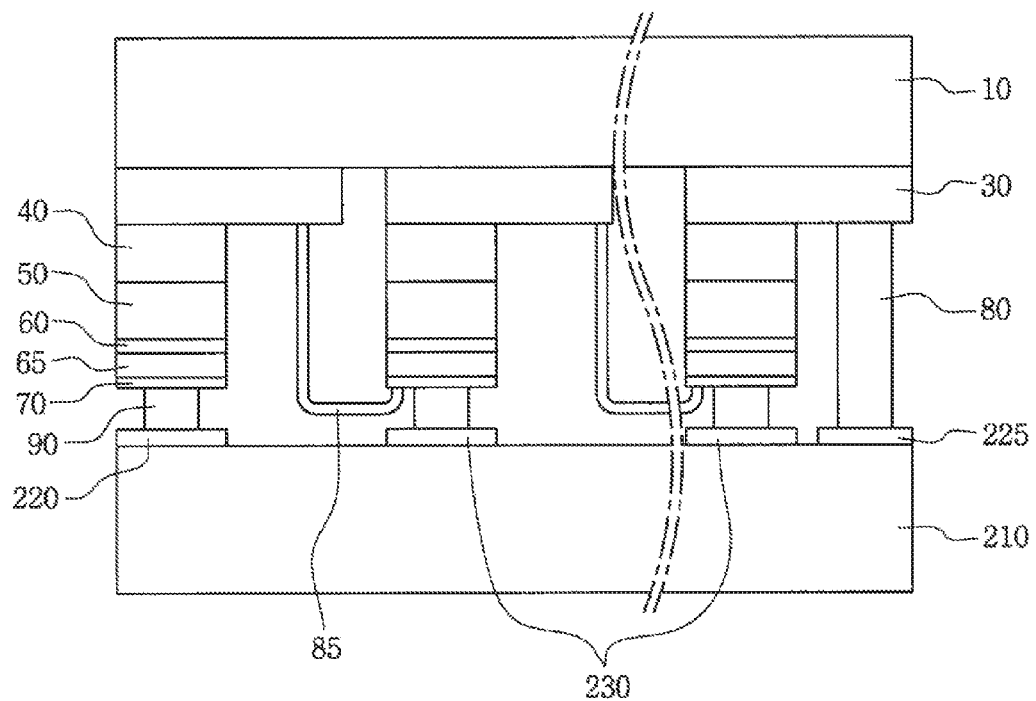

Referring to FIG. 3g, the light emitting diode according to this exemplary embodiment is fabricated by flip-chip bonding of the light emitting cell block 100 to the sub-mount substrate 200 via the metal bumps 80, 90 formed on the light emitting cells. The p-type metal bump 90 disposed at one edge of the light emitting cell block 100 is connected to the p-type bonding pad 220 on the sub-mount substrate 200, and the n-type metal bump 80 disposed at the other edge thereof is connected to the n-type bonding pad 225 of the sub-mount substrate 200. Here, bonding can be realized using heat or ultrasonic waves, or both heat and ultrasonic waves. Flip-chip bonding between the light emitting cell block 100 and the sub-mount substrate 200 is not limited to the above method and can be realized in various ways.

The metal bumps 80, 90 are not limited to particular locations and can be formed at any suitable locations so long as the locations of the metal bumps do not obstruct current flow of the bridge interconnection line 85 and do not affect flip-chip bonding. Alternatively, the metal bumps 80, 90 can be formed on the sub-mount substrate 200 instead of being formed on the light emitting cell in the light emitting cell block 100.

In this exemplary embodiment, electrical connection between components of the light emitting diode is completed through the bridge interconnection line 85 before flip-chip bonding, thereby providing an advantage by eliminating formation of a separate pattern for electrical connection upon flip-chip bonding, or accurate alignment therefor.

It should be understood that the above fabrication method of the light emitting diode is provided as one exemplary embodiment and can be modified or further include various processes according to characteristics of the light emitting diode and for process convenience. According to this exemplary embodiment, in fabrication of the light emitting cell block 100, the bridge interconnection line 85 is formed for electrical connection between the n-type semiconductor layer 30 and the p-type semiconductor layer 50 of two adjacent light emitting cells through the bridge process or the step cover process, and the sub-mount substrate 200 is then connected to the light emitting cell block 100, thereby fabricating the light emitting diode. Alternatively, the n-type semiconductor layer 30 and the p-type semiconductor layer 50 of the adjacent light emitting cells can be electrically connected to each other via metal bumps upon flip-chip bonding of the light emitting cell block 100 to the sub-mount substrate 200.

As a result, a flip-chip type light emitting diode including a plurality of light emitting cells arrayed on a sub-mount substrate can be fabricated. Here, the light emitting cells can be connected to each other in various ways in series, in parallel, or in series-parallel.

The light emitting diode according to the exemplary embodiments can reduce resistance of the p-type semiconductor layer through the ohmic contact layer on the p-type semiconductor layer, and can have improved reliability and extended lifespan with stable power-voltage operation characteristics resulting from reinforced bonding strength between the ohmic contact layer and the reflective layer. In addition, the light emitting diode according to the exemplary embodiments includes the reflective layer including an oxide instead of a separate metal layer in the related art, thereby providing improved luminous efficacy through efficient reflection of light while preventing absorption of light.

Figure 4:
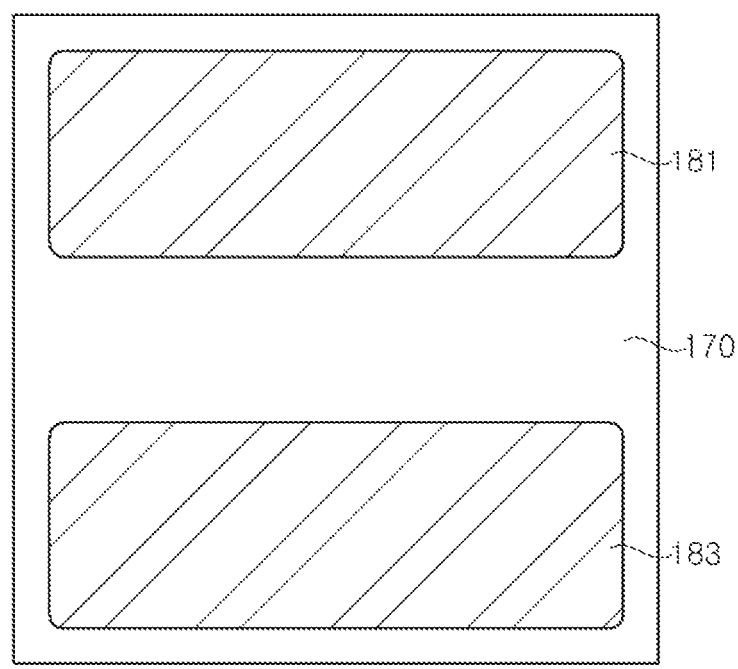
FIG. 4 and FIG. 5 are plan views of a light emitting diode according to some exemplary embodiments.
Figure 5:
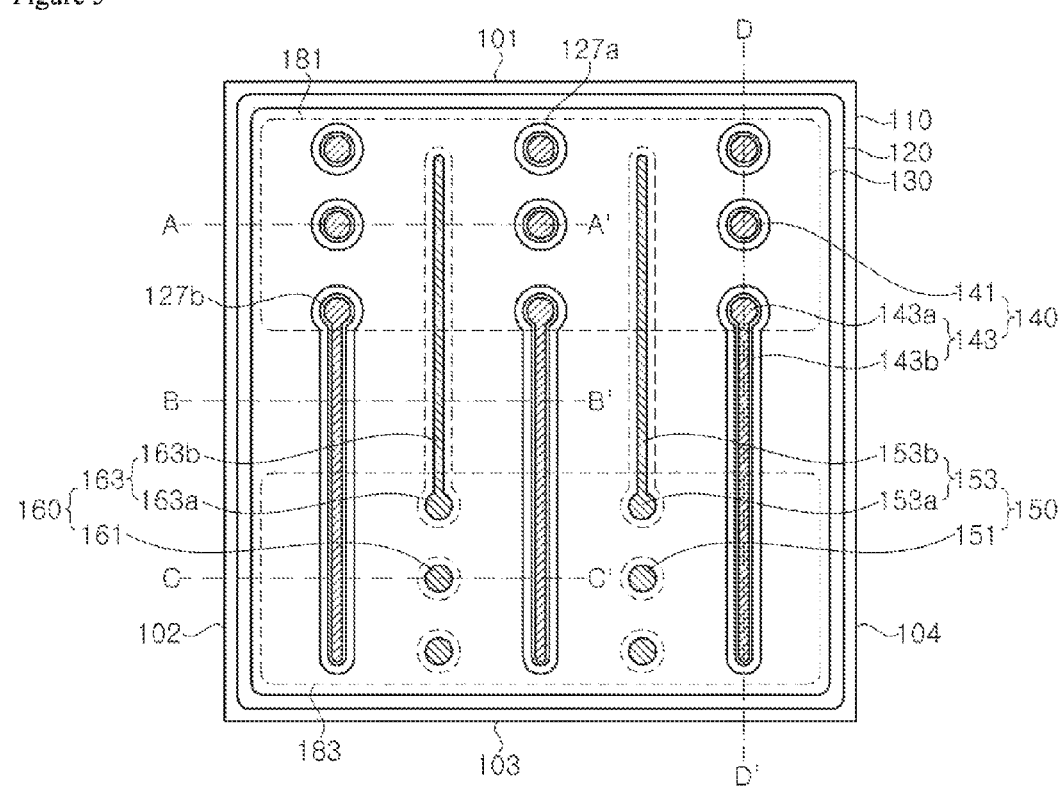

FIG. 4 and FIG. 5 are plan views of a light emitting diode according to embodiments, and FIG. 6 to FIG. 9 are side sectional views of the light emitting diode according to some other embodiments.

Figure 6:
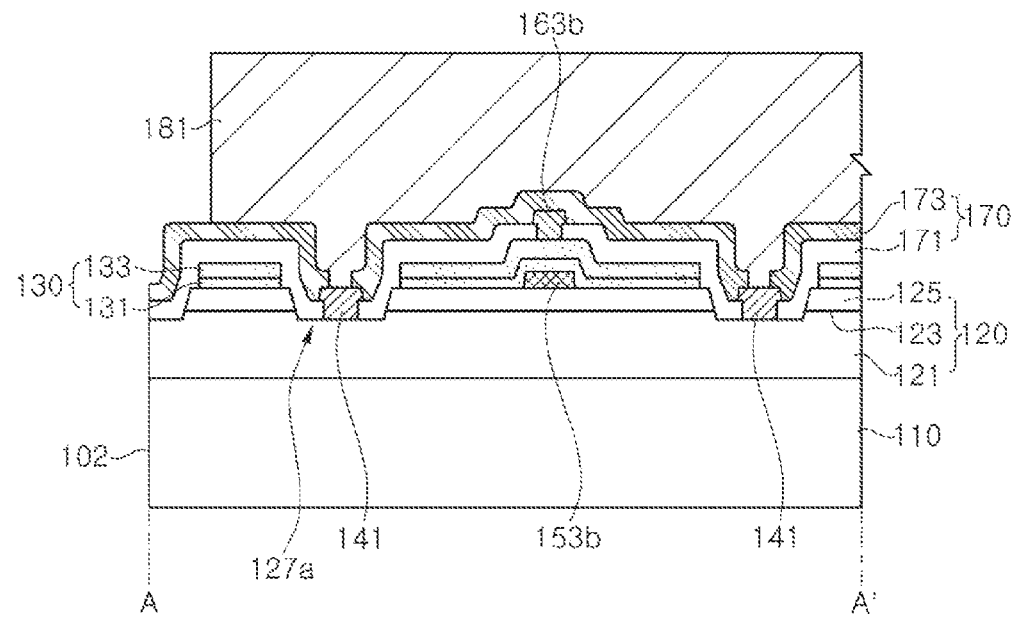
FIG. 6 to FIG. 9 are side sectional views of the light emitting diode according to some exemplary embodiments.
Figure 7:
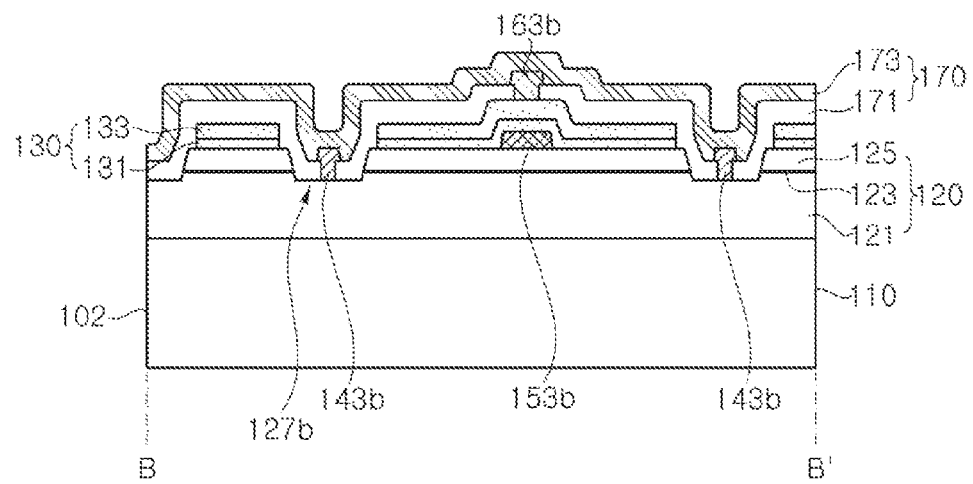
Figure 8:
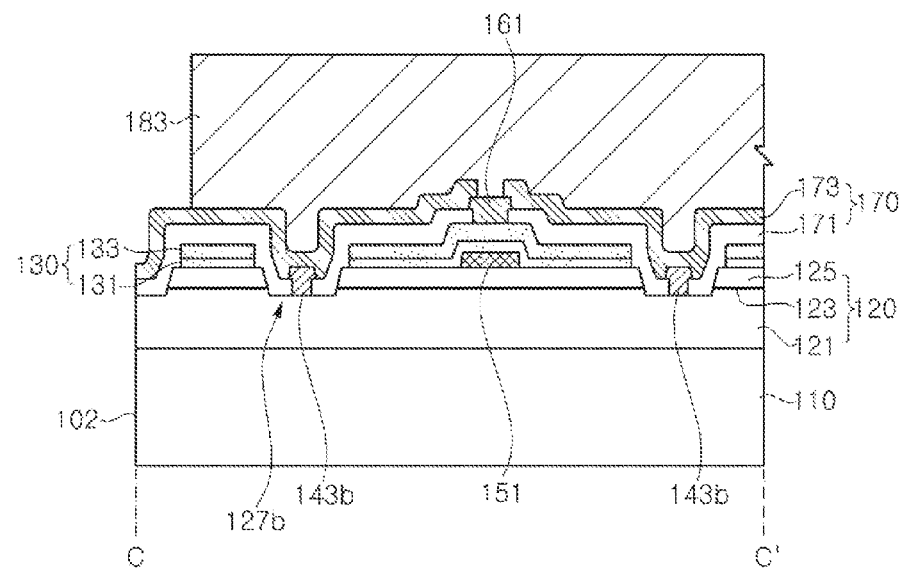
Figure 9:
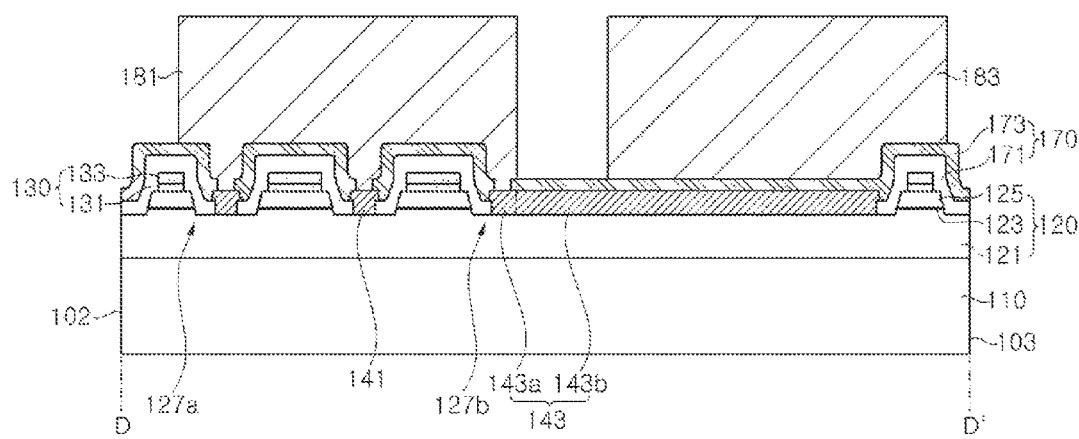

FIG. 4 and FIG. 5 are plan views of the light emitting diode. Particularly, FIG. 5 is a plan view of the light emitting diode, in which a first pad 181, a second pad 183 and an insulation layer 170 are omitted. FIG. 6 is a side sectional view taken along line A-A' of FIG. 5, FIG. 7 is a side sectional view taken along line B-B' of FIG. 5, FIG. 8 is a side sectional view taken along line C-C' of FIG. 5, and FIG. 9 is a side sectional view taken along line D-D' of FIG. 5.

Referring to FIG. 4 to FIG. 9, the light emitting diode includes a light emitting structure 120, a current spreading layer 130, a first electrode 140, a second electrode 160, and an insulation layer 170. The light emitting diode can further include a substrate 110, a current blocking layer 150, the first pad 181, and the second pad 183. In addition, the light emitting diode can have a rectangular shape in plan view. In this exemplary embodiment, the light emitting diode generally has a square shape in plan view, and can include a first side surface 101, a second side surface 102, a third side surface 103 opposite to the first side surface 101, and a fourth side surface 104 opposite to the second side surface 102. It should be understood that embodiments are not limited thereto.

The substrate 110 can be selected from any substrates so long as the substrate can grow the light emitting structure 120 thereon, and can include, for example, a sapphire substrate, a silicon carbide substrate, a silicon substrate, a gallium nitride substrate, an aluminum nitride substrate, or the like. In this exemplary embodiment, the substrate 110 can be a patterned sapphire substrate (PSS). The substrate 110 can be omitted from the light emitting diode. When the substrate 110 is used as a growth substrate for the light emitting structure, the substrate 110 can be removed from the light emitting structure 120 by a method known in the art. Alternatively, the substrate 110 can be a support substrate for supporting the light emitting structure 120 grown on a separate growth substrate.

The light emitting structure 120 can include a first conductive type semiconductor layer 121, an active layer 123 disposed on the first conductive type semiconductor layer 121, and a second conductive type semiconductor layer 125 disposed on the active layer 123. The first conductive type semiconductor layer 121, the active layer 123 and the second conductive type semiconductor layer 125 can include a III-V compound semiconductor, for example, a nitride semiconductor such as (Al, Ga, In)N. The first conductive type semiconductor layer 121 can include an n-type dopant (for example, Si) and the second conductive type semiconductor layer 125 can include a p-type dopant (for example, Mg), or vice versa. The active layer 123 can have a multi-quantum well (MQW) structure.

The light emitting structure 120 can include an exposed region of the first conductive type semiconductor layer 121 partially exposed through the second conductive type semiconductor layer 125 and the active layer 123. In various exemplary embodiments, the light emitting structure 120 can include one or more holes 127a, 127b formed through the second conductive type semiconductor layer 125 and the active layer 123 to expose a portion of the first conductive type semiconductor layer 121 therethrough.

Specifically, referring to FIG. 5, the one or more holes 127a, 127b can include a first hole 127a and a second hole 127b. The first hole 127a can generally have a circular shape or a polygonal shape in plan view. The second hole 127b can have an elongated shape extending in a certain direction, as compared with the first hole 127a. Further, the second hole 127b can include a relatively wide portion and a relatively narrow portion. For example, as shown in the drawings, the first hole 127a can have a circular shape in plan view and can be formed in plural. The second hole 127b can extend from the first side surface 101 towards the third side surface 103 and can be formed in plural. Here, the second hole 127b can have an elongated shape extending from the relatively wide portion thereof towards the third side surface 103, and a portion of the second hole extending towards the third side surface 103 can have a relatively narrow width. In addition, the relatively wide portion of the second hole 127b can have substantially the same width and shape as the first hole 127a. Further, the plurality of second holes 127b can be arranged at substantially constant intervals. In one second hole 127b, a portion of the second hole 127b can be disposed under the first pad 181 and another portion of the second hole 127b can be disposed under the second pad 183. Namely, at least one of the second holes 127b can extend from a portion under the first pad 181 to a portion under the second pad 183.

The current blocking layer 150 is partially disposed on the light emitting structure 120, particularly, on the second conductive type semiconductor layer 125. The current blocking layer 150 can be disposed at a location corresponding to the second electrode 160. The current blocking layer 150 can include a first current blocking layer 151 and a second current blocking layer 153, which can be disposed at locations corresponding to a first connection electrode 161 and a second connection electrode 163 of the second electrode 160, respectively. Furthermore, the second current blocking layer 153 can include a primary current blocking layer 153a and a secondary current blocking layer 153b disposed at locations corresponding to a main electrode 163a and an extension electrode 163b of the second connection electrode 163, respectively.

The current blocking layer 150 can prevent electric current from crowding under the second electrode 160 due to direct supply of the electric current from the second electrode 160 to the second conductive type semiconductor layer 125. Accordingly, the current blocking layer 150 can have electrical insulation properties, include an insulation material, and be composed of a single layer or multiple layers. For example, the current blocking layer 150 can include SiOx or SiNx, or can include a distributed Bragg reflector including insulation material layers having different indexes of refraction and stacked one above another. The current blocking layer 150 allows light transmission or light reflection, or can exhibit selective light reflectivity. In addition, the current blocking layer 150 can have a larger area than the second electrode 160 formed thereon. Accordingly, the second electrode 160 can be placed within a region in which the current blocking layer 150 is formed.

The current spreading layer 130 can be disposed on the second conductive type semiconductor layer 125. Furthermore, the current spreading layer 130 can cover the current blocking layer 150 and can include at least one opening that exposes the one or more holes 127a, 127b. The current spreading layer 130 can be electrically connected to the second conductive type semiconductor layer 125 and can form ohmic contact with the second conductive type semiconductor layer 125. The current spreading layer 130 can generally cover the entirety of an upper surface of the light emitting structure 120, and can be formed along an outer periphery of the upper surface of the light emitting structure 120 as shown in the drawings. Furthermore, the current spreading layer 130 can be formed along the periphery of the one or more holes 127a, 127b to expose the one or more holes 127a, 127b.

When supplied through such a current spreading layer 130, electric current can be evenly spread on the light emitting structure 120 in the horizontal direction, thereby improving current spreading efficiency of the light emitting diode. The current spreading layer 130 can be formed of a conductive material such as a metal or a conductive oxide. For example, the current spreading layer 130 can include a conductive oxide such as ITO, ZnO, IZO, GZO and AZO, a light transmitting metal layer such as Ni/Au, and a metal such as Ni, Pt, Pd, Rh, W, Ti, Al, Mg, Ag, Cr, and Au.

In some exemplary embodiments, the current spreading layer 130 can have a multilayer structure, and can include a lower current spreading layer 131 disposed on the second conductive type semiconductor layer 125 and an upper current spreading layer 133 disposed on the lower current spreading layer 131. The lower current spreading layer 131 and the upper current spreading layer 133 can have different electrical conductivities. In addition, the lower current spreading layer 131 and the upper current spreading layer 133 can have different indexes of refraction.

The lower current spreading layer 131 can form ohmic contact with the second conductive type semiconductor layer 125. In addition, the lower current spreading layer 131 can be formed of a conductive oxide doped with a predetermined dopant, thereby reducing contact resistance between the lower current spreading layer 131 and the second conductive type semiconductor layer 125. For example, the lower current spreading layer 131 can include ITO and ZnO doped with a dopant, and the dopant can include at least one selected from among silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd). In some exemplary embodiments, the current spreading layer 130 can include a transparent conductive oxide doped with at least one of Ga, Al and/or In. In these exemplary embodiments, the lower current spreading layer 131 can be formed of the transparent conductive oxide doped with at least one of Ga, Al and In. The lower current spreading layer 131 can have a thickness of about 10 Å to 1000 Å. In the lower current spreading layer 131, the dopant can be doped in a concentration of about 0.01 at % to about 40 at %, preferably about 0.01 at % to about 20 at %.

The upper current spreading layer 133 can be disposed on the lower current spreading layer 131. The upper current spreading layer 133 can have higher transmittance and lower sheet resistance than the lower current spreading layer 233. For example, in one exemplary embodiment wherein the lower current spreading layer 131 is formed of ITO or ZnO doped with a dopant, the upper current spreading layer 133 can have a greater thickness than the lower current spreading layer 131 and can be formed of undoped ITO or ZnO. An undoped conductive oxide has higher light transmittance and a greater thickness than a doped conductive oxide, thereby exhibiting relatively low horizontal resistance, that is, relatively low sheet resistance. The current spreading layer 130 can have an overall thickness of, for example, about 10,000 Å or less, specifically about 5,000 Å to 9,000 Å, more specifically about 6,000 Å, or about 8,000 Å, without being limited thereto.

In embodiments wherein the current spreading layer 130 includes the metal doped lower current spreading layer 131 and the undoped upper current spreading layer 133, the lower and upper current spreading layers 131, 133 can be similar to the ohmic contact layer 60 and the transparent conductive layer 65 described in the exemplary embodiment shown in FIG. 1, respectively.

As such, the lower current spreading layer 131 having a relatively thin thickness and formed of ITO or ZnO doped with a metal is formed to make electrical contact with the second conductive type semiconductor layer 125, so that the lower current spreading layer 131 can have high light transmittance and improved ohmic characteristics. In addition, the upper current spreading layer 133 is formed to a relatively thick thickness and formed of undoped ITO or ZnO, thereby improving current spreading efficiency in the horizontal direction. That is, according to this exemplary embodiment, the light emitting diode includes the current spreading layer 130 having a multilayer structure of the lower and upper current spreading layers 131, 133, thereby improving ohmic characteristics and current spreading efficiency to reduce forward voltage Vf of the light emitting diode, while improving luminous efficacy of the light emitting diode through improvement in light transmittance.

In some embodiments, the current spreading layer 130 can be composed of a single layer. Here, the current spreading layer 130 composed of a single layer can include a transparent conductive oxide having improved ohmic characteristics and light transmittance. For example, the current spreading layer 130 can include a single layer formed of ZnO exhibiting higher light transmittance than ITO.

The insulation layer 170 can cover the upper surfaces of the light emitting structure 120 and the current spreading layer 130 and can include openings exposing the first and second electrodes 140, 160. In addition, the insulation layer 170 can include a lower insulation layer 171 and an upper insulation layer 173. Although the lower insulation layer 171 and the upper insulation layer 173 will be described in more detail, it should be understood that embodiments are not limited thereto.

The lower insulation layer 171 can cover a side surface and the upper surface of the light emitting structure 120 and the current spreading layer 130, and can include openings that partially expose the current spreading layer 130. Further, the lower insulation layer 171 can cover side surfaces of the one or more holes 127a, 127b and can include openings that partially expose the first conductive type semiconductor layer 121, which is exposed through the one or more holes 127a, 127b. Portions exposed through the openings of the lower insulation layer 171 can correspond to the locations of the first and second electrodes 140, 160. In this exemplary embodiment, the first conductive type semiconductor layer 121 exposed through the first hole 127*a* and the second hole 127*b* can be partially exposed through the openings. In this structure, the side surfaces of the first and second holes 127*a*; 127*b* can be at least partially coved by the lower insulation layer 171. In addition, portions of the current spreading layer 130 exposed through the openings of the lower insulation layer 171 can be placed at a top portion of the current blocking layer 150.

The lower insulation layer 171 can include an insulation material, for example, $SiO_2$, $SiN_x$, $MgF_2$, and the like. In some exemplary embodiments, the lower insulation layer 171 can act as a basal layer with respect to other layers formed on the lower insulation layer 171. For example, in the structure wherein the upper insulation layer 173 includes a distributed Bragg reflector, the lower insulation layer 171 can act as a basal layer that enables stable formation of the distributed Bragg reflector. In the distributed Bragg reflector having a multilayer structure of $TiO_2/SiO_2$ layers alternately stacked one above another, the lower insulation layer 171 can be formed of a $SiO_2$ layer having a predetermined thickness or more. For example, the thickness can range from about 0.2 μm to 1.0 μm.

In order to form a high quality distributed Bragg reflector, it is useful that a basal layer for the distributed Bragg reflector have good quality and surface properties. Accordingly, the lower insulation layer 171 is formed to the predetermined thickness or more, thereby enabling stable formation of the distributed Bragg reflector on the lower insulation layer 171.

The first electrode 140 is electrically connected to the first conductive type semiconductor layer 121. The first electrode 140 is disposed on an exposed region of the first conductive type semiconductor layer 121 to form ohmic contact with the first conductive type semiconductor layer 121. Particularly, the first electrode 140 can form ohmic contact with the first conductive type semiconductor layer 121 through the one or more holes 127*a*, 127*b*. In addition, the first electrode 140 is electrically connected to the first pad 181. In this exemplary embodiment, the first electrode 140 can include at least one first ohmic contact electrode 141 and at least one second ohmic contact electrode 143.

The first ohmic contact electrode 141 can be placed in at least a portion of the first holes 127*a* and can form ohmic contact with the first conductive type semiconductor layer 121 through the openings of the lower insulation layer 171, which partially expose the first holes 127*a*. In the structure wherein the first hole 127*a* is formed in plural, the first ohmic contact electrode 141 can be placed in the plurality of first holes 127*a*. Furthermore, the first ohmic contact electrode 141 can be disposed to overlap a region in which the first pad 181 is formed, in the vertical direction. That is, the first ohmic contact electrode 141 can be disposed under the first pad 181, particularly within the region in which the first pad 181 is formed. Accordingly, the first ohmic contact electrode 141 can contact the first pad 181. The second ohmic contact electrode 143 can be disposed within a primary contact hole 127*a* and a secondary contact hole 127*b*.

The second ohmic contact electrode 143 can be placed in at least a portion of the second holes 127*b* and can form ohmic contact with the first conductive type semiconductor layer 121 through the openings of the lower insulation layer 171, which partially expose the first holes 127*a*. In the structure wherein the second hole 127*b* is formed in plural, the second ohmic contact electrode 143 can be placed in the plurality of second holes 127*b*. The second ohmic contact electrode 143 can be formed in the form of extending in a direction in which the second holes 127*b* extend. In this exemplary embodiment, the second ohmic contact electrode 143 can extend from the first side surface 101 towards the third side surface 103. Particularly, the second ohmic contact electrode 143 can include a main electrode 143*a* disposed under the first pad 181 and an extension electrode 143*b* extending from the main electrode 143*a* and disposed under a region between the first pad 181 and the second pad 183. Accordingly, the main electrode 143*a* can contact the first pad 181 and the extension electrode 143*b* can extend towards the second pad 183. Furthermore, the extension electrode 143*b* can further extend to a portion under the second pad 183. In this structure, electrons supplied through the main electrode 143*a* contacting the first pad 181 can be easily spread to the extension electrode 143*b*. Accordingly, this structure relieves current crowding in the first conductive type semiconductor layer 121 disposed under the main electrode 143*a*, thereby improving current spreading efficiency. The main electrode 143*a* can have a greater width than the extension electrode 143*b*, whereby electric current can be efficiently supplied to the second ohmic contact electrode 143 through the main electrode 143*a*.

The second electrode 160 can be disposed on the current spreading layer 130 and electrically connected to the current spreading layer 130. Particularly, the second electrode 160 can be disposed above the current blocking layer 150, so that the current spreading layer 130 can be partially interposed between the second electrode 160 and the current blocking layer 150. In addition, the second electrode 160 can be electrically connected to the second pad 183, and the current spreading layer 130 can be electrically connected to the second pad 183 through the second electrode 160. The second electrode 160 can include at least one first connection electrode 161 and at least one second connection electrode 163.

The first connection electrode 161 can contact the current spreading layer 130 through the openings of the lower insulation layer 171. In addition, the first connection electrode 161 can be disposed to overlap a region, in which the second pad 183 is formed, in the vertical direction. That is, the first connection electrode 161 can be disposed under the second pad 183, particularly, within the region in which the second pad 183 is formed. Accordingly, the first connection electrode 161 can contact the second pad 183. In the structure wherein the first connection electrode 161 is formed in plural, a plurality of first connection electrodes 161 can be separated from each other. However, it should be understood that embodiments are not limited thereto and the plurality of first connection electrodes 161 can be connected to each other.

At least a portion of the second connection electrode 163 can be disposed to overlap the region in which the second pad 183 is formed, in the vertical direction. The second connection electrode 163 can include a main electrode 163*a* disposed under the second pad 183 to contact the second pad 183 and an extension electrode 163*b* extending from the main electrode 163*a*. The extension electrode 163*b* can extend from the second pad 183 in a direction of approaching the first pad 181. In this exemplary embodiment, the extension electrode 163*b* can extend from the third side surface 103 towards the first side surface 101. In addition, the extension electrode 163*b* can extend to a portion under a region between the first pad 181 and the second pad 183, particularly, to a region under the first pad 181. A portion of the extension electrode 163*b* extending to the region under the first pad 181 is electrically insulated from the first pad 181 by the upper insulation layer 173 described below. As such, the second connection electrode 163 includes the extension electrode 163b extending to the region under the first pad 181, thereby enabling efficient spreading of electric current to a portion under a region between the first and second pads 181, 183 and to a portion of the second conductive type semiconductor layer 125 under the first pad 181, while preventing current crowding in the second conductive type semiconductor layer 125 under the main electrode 163a.

On the other hand, the extension electrode 163b can have a narrower width than the main electrode 163a. Accordingly, electric current can be efficiently supplied from the second pad 183 to the second connection electrode 163 through the main electrode 163a, and then can be efficiently spread through the extension electrode 163b.

In some exemplary embodiments, at least some of the first electrodes 140 can be disposed between the plurality of second electrodes 160, and at least some of the second electrodes 160 can be disposed between the plurality of first electrodes 140. As shown in FIG. 5, in the structure wherein the second connection electrode 163 is formed in plural, at least some of the first electrodes 140 can be disposed between the extension electrodes 163b. The first and second ohmic contact electrodes 141, 143 can be disposed between two second electrodes 160. With this structure, the light emitting diode can achieve more efficient current spreading.

In some exemplary embodiments, at least some of the first and second electrodes 140, 160 can cover the upper surface of the lower insulation layer 171. That is, at least some of the first and second electrodes 140, 160 fill the openings of the lower insulation layer 171 while covering the upper surface of the lower insulation layer 171 around the openings thereof.

The upper insulation layer 173 covers the lower insulation layer 171 while partially covering the first electrodes 140 and the second electrodes 160. The upper insulation layer 173 can include openings at least partially exposing each of the first electrodes 140 and the second electrodes 160.

First, at least some of the first and second ohmic contact electrodes 141, 143 of the first electrode 140 can be exposed through the openings of the upper insulation layer 173 and electrically connected to the first pad 181 through the openings. Particularly, at least a portion of the main electrode 143a of the second ohmic contact electrode 143 is exposed through the opening of the upper insulation layer 173 and the extension electrode 143b of the second ohmic contact electrode 143 is covered by the upper insulation layer 173. Accordingly, the extension electrode 143b disposed under the second pad 183 is insulated from the second pad 183 through the upper insulation layer 173.

At least some of the first connection electrodes 161 of the second electrode 160 can be exposed through the openings of the upper insulation layer 173 and electrically connected to the second pad 183 through the openings thereof. Some of the second connection electrodes 163 of the second electrode 160 can be exposed through the openings of the upper insulation layer 173 and the other of the second connection electrodes 163 can be covered by the upper insulation layer 173. Specifically, at least a portion of the main electrode 163a of the second connection electrode 163 is exposed through the opening of the upper insulation layer 173 and the extension electrode 163b thereof is covered by the upper insulation layer 173. Accordingly, the extension electrode 163b disposed under the first pad 181 is insulated from the first pad 181 through the upper insulation layer 173.

As such, portions of the first and second electrodes 240, 250 disposed under the region between the first and second pads 181, 183 are covered by the upper insulation layer 173 to be insulated therefrom, thereby preventing short circuit between the first and second pads 181, 183 due to solders or impurities.

The upper insulation layer 173 can include an insulation material, for example, $SiO_2$, $SiN_x$, $MgF_2$, and the like. In some exemplary embodiments, the upper insulation layer 173 can include a distributed Bragg reflector. The distributed Bragg reflector can be formed by repeatedly stacking dielectric layers having different indexes of refraction one above another, and the dielectric layers can include, for example, $TiO_2$, $SiO_2$, $HfO_2$, $ZrO_2$, $Nb_2O_5$, and the like. In some exemplary embodiments, the upper insulation layer 173 can have a multilayer structure of $TiO_2/SiO_2$ layers alternately stacked one above another. The distributed Bragg reflector can include 4 to 20 pairs of dielectric layers, each of which can have an optical thickness of ¼ of a certain wavelength. However, it should be understood that embodiments are not limited thereto. In one exemplary embodiment wherein the upper insulation layer 173 has a multilayer structure, an uppermost layer of the upper insulation layer 173 can be formed of $SiN_x$. The layer formed of $SiN_x$ exhibits excellent anti-moisture properties, thereby protecting the light emitting diode from moisture.

In embodiments wherein the upper insulation layer 173 includes the distributed Bragg reflector, the lower insulation layer 171 can act as a basal layer or an interface layer capable of improving quality of the distributed Bragg reflector. For example, the lower insulation layer 171 can be an $SiO_2$ layer having a thickness of about 0.2 μm to 1.0 μm, and the upper insulation layer 173 can be composed of the distributed Bragg reflector having a multilayer structure of $TiO_2/SiO_2$ layers repeatedly stacked one above another. In this exemplary embodiment, a layer of the upper insulation layer 173 contacting the lower insulation layer 171 can be a $TiO_2$ layer.

The distributed Bragg reflector can exhibit relatively high reflectivity with respect to visible light of wavelengths. The distributed Bragg reflector can be designed to have a reflectivity of 90% or more with respect to light having an incidence angle of 0-60° and a wavelength of 400 nm to 700 nm. The distributed Bragg reflector having this reflectivity can be provided by regulating the kind, thickness, and stacking cycle of dielectric layers constituting the distributed Bragg reflector. Accordingly, it is possible to form a distributed Bragg reflector capable of exhibiting high reflectivity with respect to light of relatively long wavelengths (for example, 550 nm to 700 nm) and light of relatively short wavelengths (for example, 400 nm to 550 nm).

In this way, the distributed Bragg reflector can have the multilayer structure so as to have high reflectivity with respect to light in a wide wavelength band. Namely, the distributed Bragg reflector can include a first stack structure in which dielectric layers having a first thickness are stacked one above another and a second stack structure in which dielectric layers having a second thickness are stacked one above another. For example, the distributed Bragg reflector can include a first stack structure in which dielectric layers having a smaller thickness than an optical thickness of ¼ of a center wavelength (about 550 nm) of visible light are stacked one above another, and a second stack structure in which dielectric layers having a greater thickness than the optical thickness of ¼ of the center wavelength (about 550 nm) of visible light are stacked one above another. Furthermore, the distributed Bragg reflector can further include a third stack structure in which dielectric layers having a greater thickness than the optical thickness of ¼ of the center wavelength (about 550 nm) of visible light and dielectric layers having a smaller thickness than the optical thickness of ¼ of the center wavelength (about 550 nm) of visible light are alternately stacked one above another.

As light is reflected from the distributed Bragg reflector of the upper insulation layer 173 covering substantially the entirety of the upper surface of the light emitting structure 120, the light emitting diode can have improved luminous efficacy. In addition, as described above, since the current spreading layer 130 can be composed of multiple layers to exhibit relatively high light transmittance, light loss due to absorption of light by the distributed Bragg reflector and the current spreading layer 130 can be reduced, thereby improving luminous efficacy of the light emitting diode.

Further, the upper insulation layer 173 can partially cover the upper surfaces of the first and second electrodes 140, 160. As shown in FIG. 6 to FIG. 9, at least some of the first electrodes 140 and the second electrodes 160 can further cover the upper surface of the lower insulation layer 171, and the upper insulation layer 173 can further cover at least some of the first electrodes 140 and the second electrodes 160. In this structure, at least some of the first electrodes 140 and the second electrodes 160 can be interposed between the lower insulation layer 171 and the upper insulation layer 173. Accordingly, the first electrodes 140 and the second electrodes 160 can be stably secured to prevent increase in forward voltage and variation of luminous patterns due to delamination of the electrodes 140, 160, thereby improving electrical and optical reliability of the light emitting diode.

Although the insulation layer 170 is illustrated as including the lower insulation layer 171 and the upper insulation layer 173 in this exemplary embodiment, it should be understood that embodiments are not limited thereto. In other exemplary embodiments, the insulation layer 170 can be composed of a single layer or can be a single layer of a multilayer structure instead of being separately formed. In these exemplary embodiments, the electrodes 140, 160 cannot have a portion interposed between the insulation layers 170.

The first pad 181 and the second pad 183 are disposed on the upper insulation layer 173. The first pad 181 and the second pad 183 are electrically connected to the first electrode 140 and the second electrode 160, respectively. Particularly, the first pad 181 can contact parts of the first ohmic contact electrode 141 and the second ohmic contact electrode 143, and the second pad 183 can contact a portion of the second connection electrode 163 while contacting the first connection electrode 161.

In another exemplary embodiment, the light emitting diode can further include a heat dissipation pad (not shown). The heat dissipation pad can be disposed on the insulation layer 170 to be electrically insulated from the first and second electrodes 140, 160.

The technical features and components of the above exemplary embodiments can also be applied to various other exemplary embodiments disclosed herein.

FIG. 10 to FIG. 17 are plan views and sectional views illustrating a method of fabricating a light emitting diode according to some embodiments.

In each of the drawings of this exemplary embodiment, (a) is a plan view and (b) is a sectional view taken along line D-D' of the plan view (a). Detailed descriptions of the same components as those of the exemplary embodiment shown in FIG. 4 to FIG. 9 will be omitted.

Figure 10A:
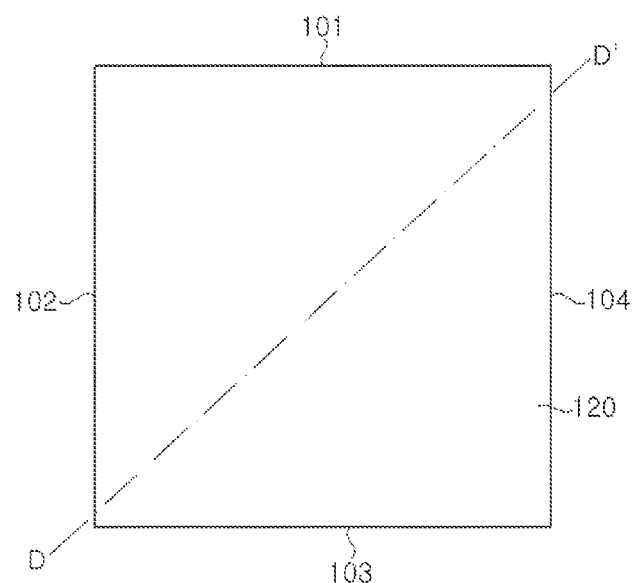
FIG. 10a to FIG. 17b are plan views and sectional views illustrating a method of fabricating a light emitting diode according to some other exemplary embodiments.
Figure 10B:
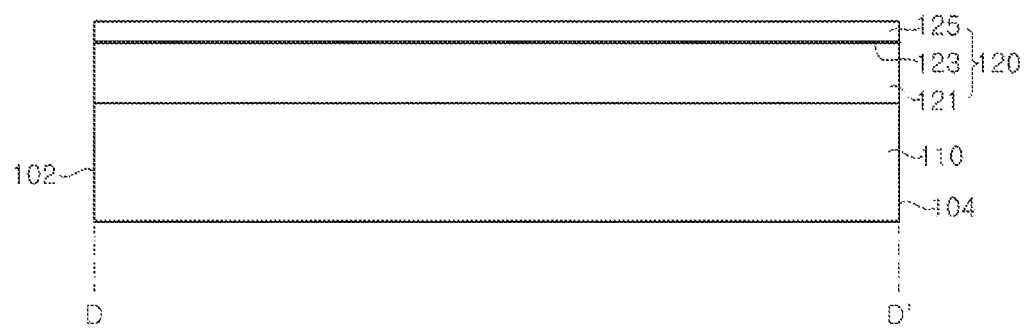

Referring to FIG. 10, a light emitting structure 120 including a first conductive type semiconductor layer 121, an active layer 123 and a second conductive type semiconductor layer 125 is formed on a growth substrate 110.

As the growth substrate 110, any substrate can be used so long as the substrate allows growth of the light emitting structure 120 thereon. For examples, the growth substrate 110 can be a sapphire substrate, a silicon carbide substrate, a silicon substrate, a gallium nitride substrate, an aluminum nitride substrate, and the like. The light emitting structure 120 can be grown by metal-organic chemical vapor deposition (MOCVD), hydride vapor phase epitaxy (HVPE), molecular beam epitaxy (MBE), or the like.

It should be noted that, although FIG. 10 shows the growth substrate 110 and the light emitting structure 120 corresponding to a single light emitting device, the present embodiment can also be applied to a wafer including the light emitting structure 120 grown on the growth substrate 110 in substantially the same manner. In this case, a plurality of light emitting diodes can be obtained from the wafer.

Figure 11A:
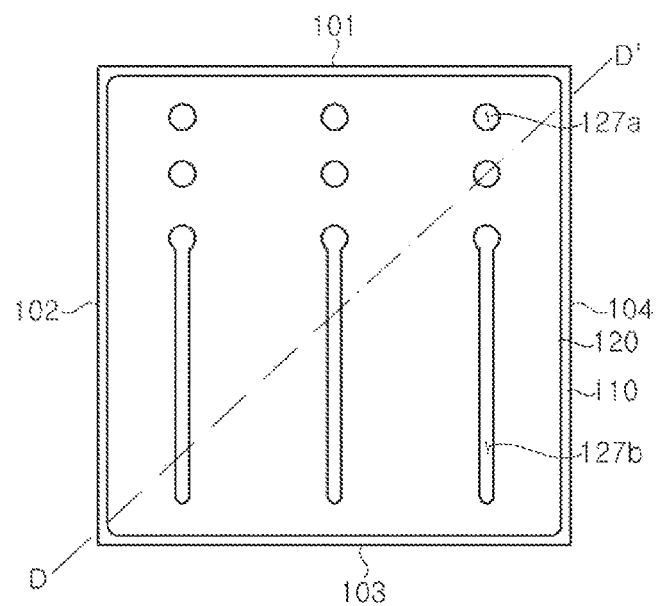
Figure 11B:
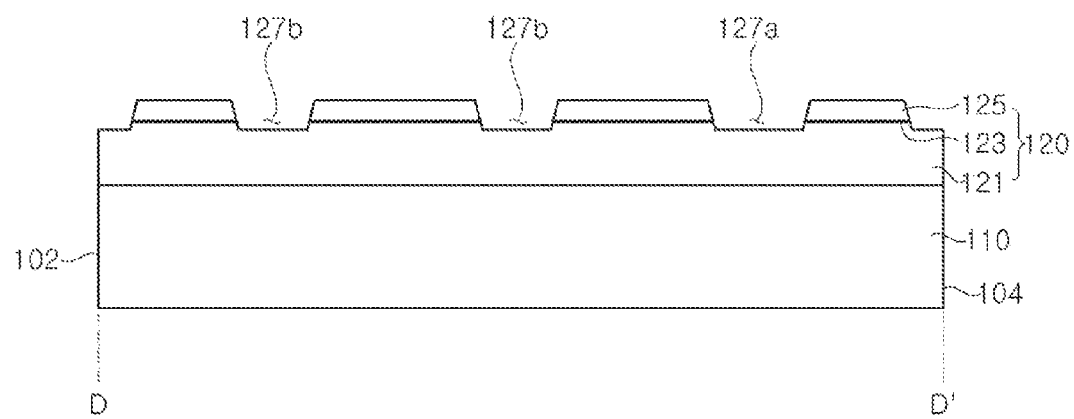

Referring to FIG. 11, the light emitting structure 120 is partially removed to form one or more holes 127*a*, 127*b*.

The one or more holes 127*a*, 127*b* can be formed through a patterning process. For example, the one or more holes 127*a*, 127*b* can be formed by partially removing the second conductive type semiconductor layer 125 and the active layer 123 through photolithography and etching. Formation of the one or more holes 127*a*, 127*b* can include forming a first hole 127*a* and a second hole 127*b*. The one or more holes 127*a*, 127*b* can be formed in a region corresponding to a first electrode 140. Accordingly, arrangement of the one or more holes 127*a*, 127*b* can be modified in various ways by taking current spreading efficiency of the light emitting diode into account.

Figure 12A:
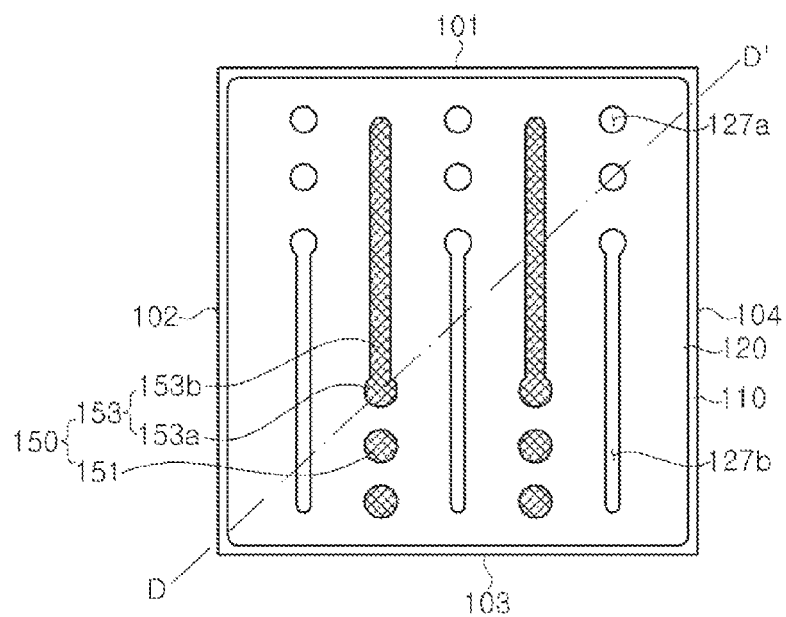
Figure 12B:
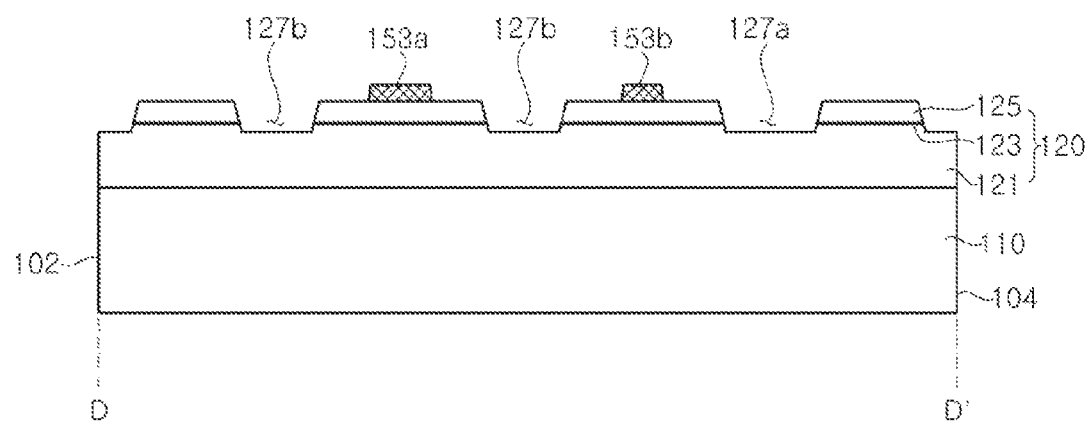

Next, referring to FIG. 12, the current blocking layer 150 is formed on the second conductive type semiconductor layer 125. The current blocking layer 150 can be formed in a region in which a second electrode 160 will be formed in another process described below. Formation of the current blocking layer 150 can include forming a first connection electrode current blocking layer 151 at a location corresponding to the first connection electrode 161 and a second connection electrode current blocking layer 153 at a location corresponding to the second connection electrode 163. In addition, the second connection electrode current blocking layer 153 can include a main electrode current blocking layer 153*a* and an extension electrode current blocking layer 153*b*.

The current blocking layer 150 can include an insulation material and can be formed on the second conductive type semiconductor layer 125 by a method known in the art. For example, the current blocking layer 150 can be formed over the upper surface of the light emitting structure 120 through sputtering, e-beam evaporation, or deposition and curing, followed by a patterning process using wet etching or dry etching. Alternatively, a photoresist mask can be first formed and the current blocking layer can be deposited through the photoresist mask, followed by removal of the photoresist through a lift-off process, thereby providing the current blocking layer 150 as shown in the drawings.

Figure 13A:
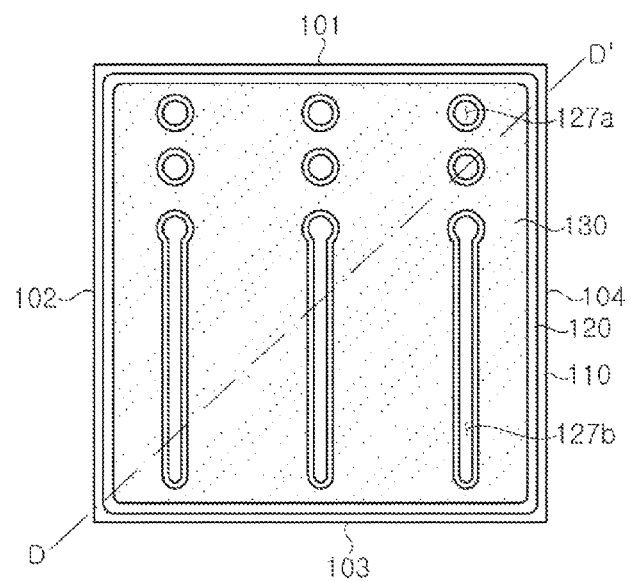
Figure 13B:
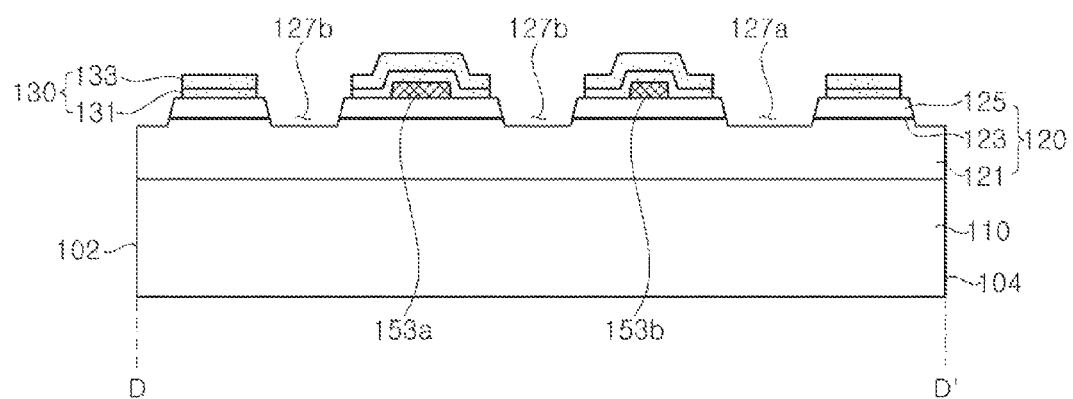

Referring to FIG. 13, a current spreading layer 130 is formed on the second conductive type semiconductor layer 125 to cover the current blocking layer 150.

The current spreading layer 130 can include a conductive oxide, for example, ITO, ZnO, and the like. In addition, formation of the current spreading layer 130 can include a lower current spreading layer 131 and an upper current spreading layer 133. The lower and upper current spreading layers 131, 133 can be sequentially formed by a separate process, or can be formed by different processes. For example, the lower current spreading layer 131 can be formed of ITO doped with a metal dopant, and the upper current spreading layer 133 can be formed of undoped ITO. Here, the lower and upper current spreading layers 231, 233 can be formed by e-beam evaporation or sputtering, or can be formed by different methods. The current spreading layer 130 including the conductive oxide can have a predetermined pattern formed through etching.

However, it should be understood that embodiments are not limited thereto. In some exemplary embodiments wherein the current spreading layer 130 is formed of a metal, the current spreading layer 130 can be formed by plating, deposition, and the like, and can have a pattern formed through a lift-off process.

Although the current spreading layer 130 is illustrated as being formed after formation of the at least one hole 127a; 127b and the current blocking layer 150 in this exemplary embodiment, it should be understood that embodiments are not limited thereto. Alternatively, the at least one hole 127a; 127b can be formed by etching the current spreading layer 130 and the light emitting structure 120 in the same process after formation of the current blocking layer 150 and the current spreading layer 130.

Figure 14A:
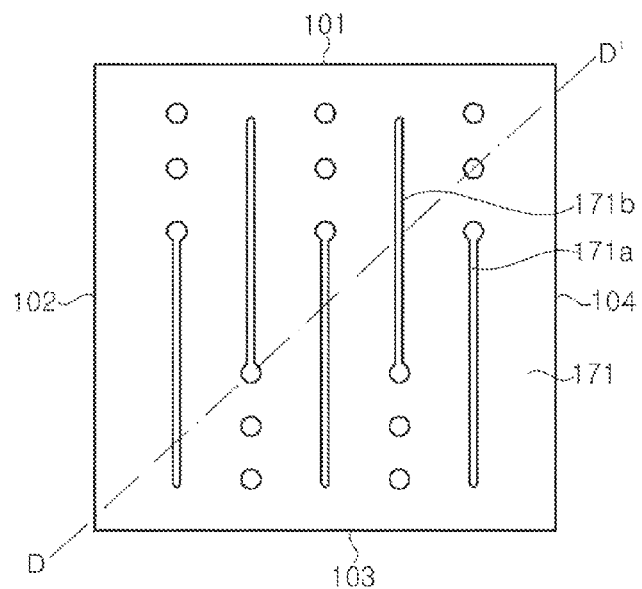
Figure 14B:
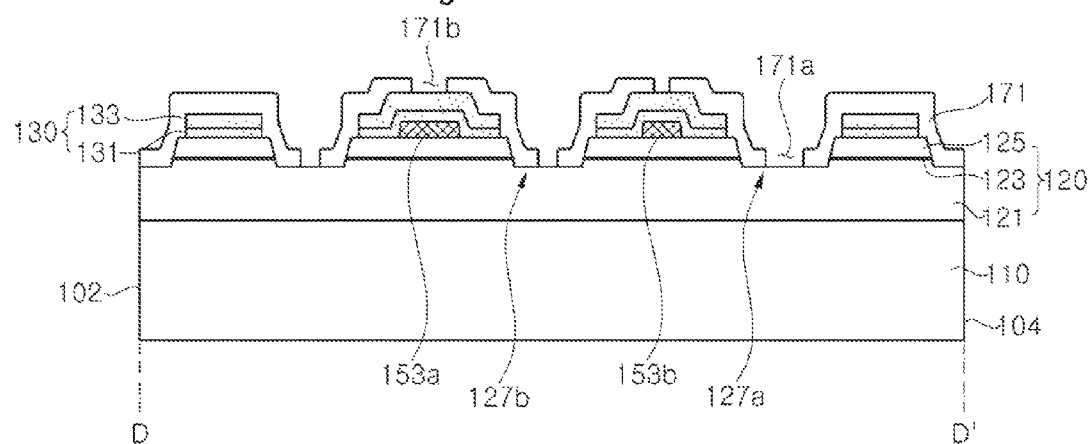

Next, referring to FIG. 14, a lower insulation layer 171 is formed to partially cover the light emitting structure 120 and the current spreading layer 130. Formation of the lower insulation layer 171 can include depositing an insulation material such as $SiO_2$ over the upper surfaces of the light emitting structure 120 and the current spreading layer 130, following by forming first and second openings 171a, 171b through a patterning process.

The first opening 171a can expose at least some of the first and second holes 127a, 127b, and the second opening 171b can partially expose the current spreading layer 130. The first and second openings 171a, 173b can be formed at locations corresponding to first and second electrodes 140, 160, respectively.

Figure 15A:
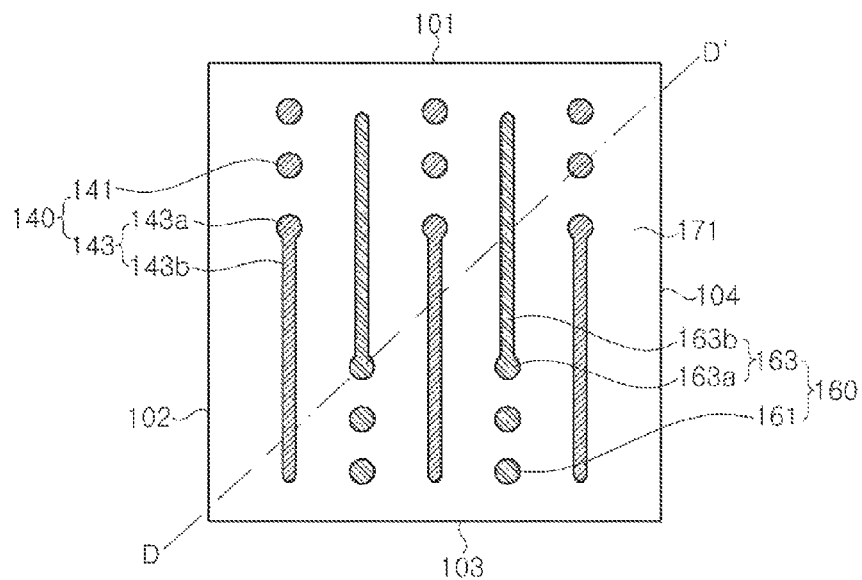
Figure 15B:
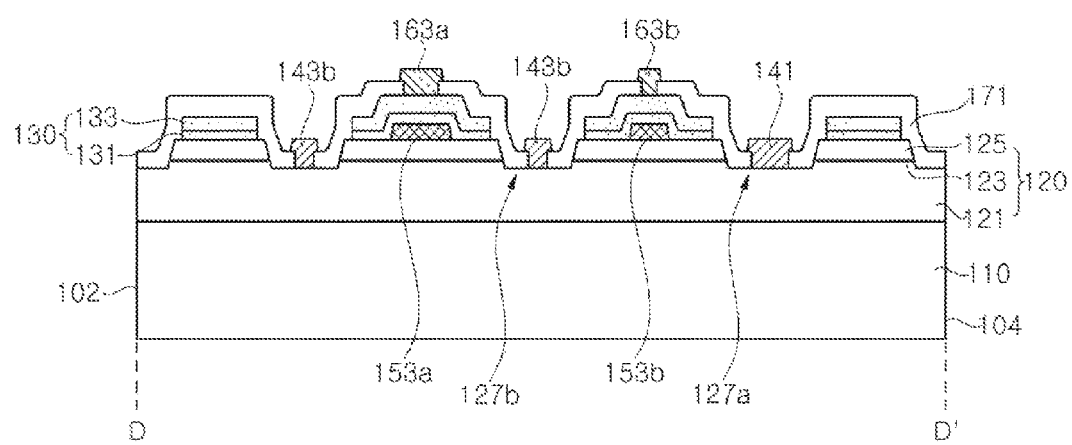

Next, referring to FIG. 15, the first and second electrodes 140, 160 are formed to at least partially fill the first and second openings 171a, 173b of the lower insulation layer 171. The first and second electrodes 140, 160 can be formed by the same process, and can be formed by deposition and lift-off. In one exemplary embodiment wherein the first and second electrodes 140, 160 are formed in a multilayer structure through the same process, the first and second electrodes 140, 160 can have the same multilayer structure. Alternatively, the first and second electrodes 140, 160 can be formed of different materials and can include different layers through different processes. In addition, the first electrodes 140 and the second electrodes 160 can further cover the upper surface of the lower insulation layer 171 around the first and second openings 171a, 171b, respectively.

In this exemplary embodiment, the lower insulation layer 171 is first formed, and then first and second electrodes 140, 160 are formed. In alternative exemplary embodiments, the first and second electrodes 140, 160 can be formed, and then the lower insulation layer 171 can be formed to partially cover the light emitting structure 120 and the current spreading layer 130. In these exemplary embodiments, the lower insulation layer 171 can be separated from side surfaces of the first and second electrodes 140, 160, or can partially cover the side surfaces of the first and second electrodes 140, 160 and upper surfaces of the first and second electrodes 140, 160.

Figure 16A:
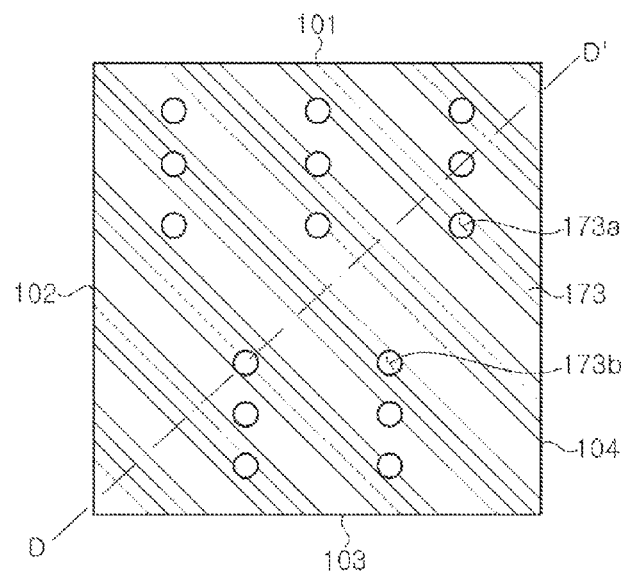
Figure 16B:
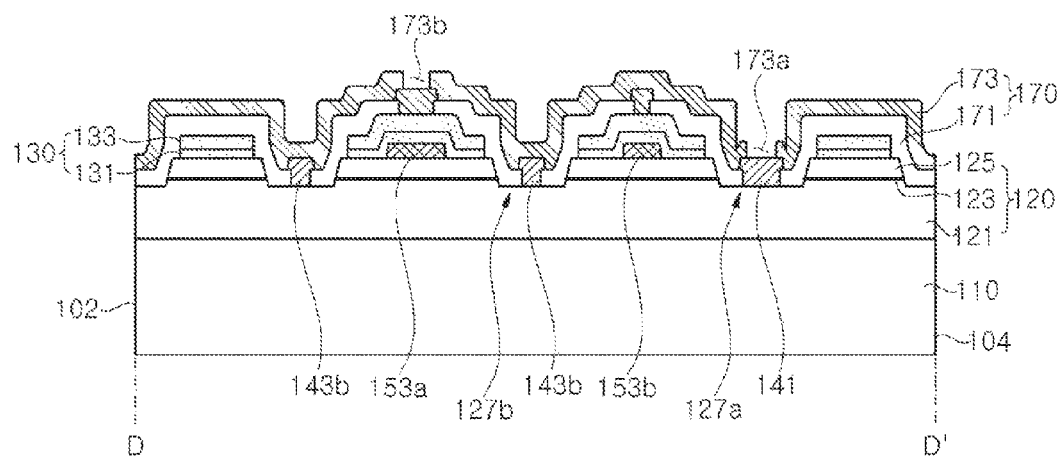

Next, referring to FIG. 16, an upper insulation layer 173 is formed on the lower insulation layer 171 to partially cover the first and second electrodes 140, 160. The upper insulation layer 173 can be formed as a distributed Bragg reflector by alternately stacking materials having different indexes of refraction, and the lower insulation layer 171 can act as an interface layer or a basal layer of the distributed Bragg reflector. The upper insulation layer 173 can be formed by deposition and etching processes known in the art. The upper insulation layer 173 can include third and fourth openings 173a, 173b, and the first electrode 140 and the second electrode 160 can be exposed through the third and fourth openings 173a, 173b, respectively.

Figure 17A:
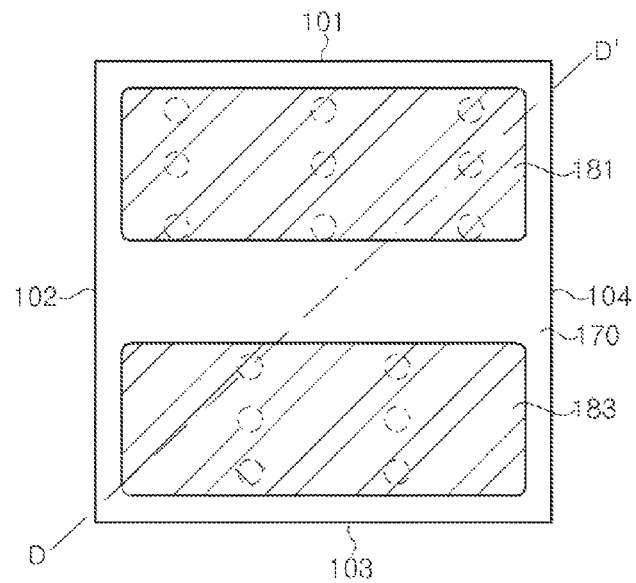
Figure 17B:
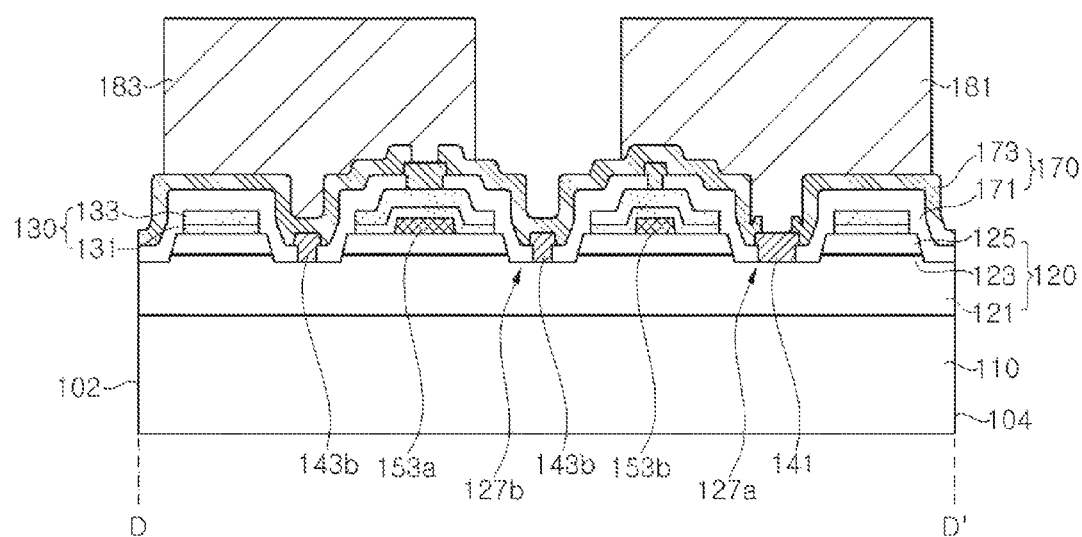

Next, referring to FIG. 17, a first pad 181 and a second pad 183 can be further formed on the upper insulation layer 173. As a result, a light emitting diode can be provided as shown in FIG. 4 to FIG. 9.

The first pad 181 can contact the first electrode 140 through the third opening 173a of the upper insulation layer 173. Similarly, the second pad 183 can contact the second electrode 160 through the fourth opening 173b of the upper insulation layer 173. The first and second pads 181, 183 can be formed at the same time by the same process, for example, by a photolithography and etching technology or a lift-off technology.

In addition, the method of fabricating the light emitting diode can further include separating the substrate 110 from the light emitting structure 120. The substrate 110 can be separated or removed by physical and/or chemical methods.

The exemplary embodiments disclosed herein provide a light emitting diode having improved electrical conductivity and reliability, thereby improving lifespan and reliability of products employing the light emitting diode. In addition, the method of fabricating a light emitting diode according to the exemplary embodiments described in the present document can stabilize a fabrication process to reduce manufacturing costs, and can be applied to fabrication of top-emitting light emitting diodes (TELEDs), flip-chip type LEDs and vertical LEDs (VLED). Furthermore, the disclosed techniques can also be applied to various fields including light receiving devices, organic electroluminescent light emitting diodes (OLED), solar cells, LCDs, semiconductor processes, and the like.

Figure 18:
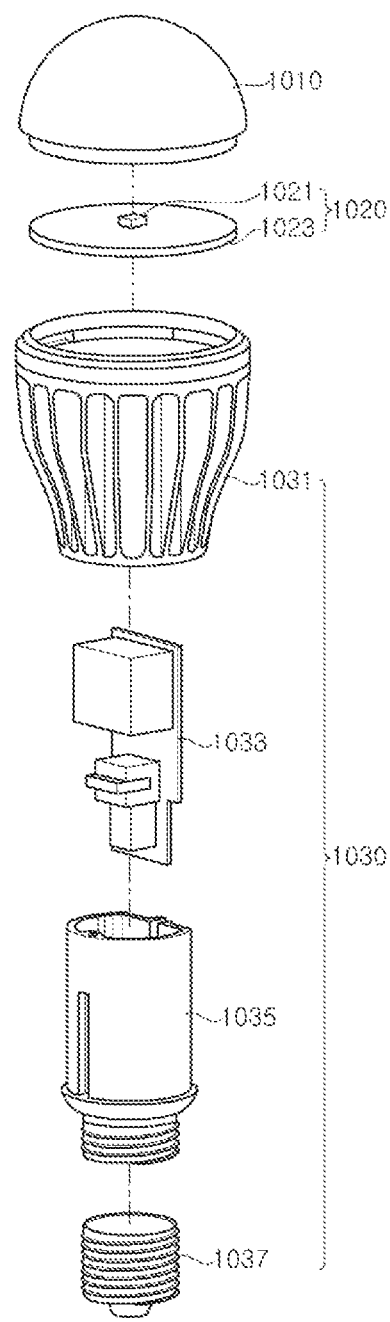
FIG. 18 is an exploded perspective view of an exemplary lighting apparatus to which a light emitting device according to some exemplary embodiments.

FIG. 18 is an exploded perspective view of an exemplary lighting apparatus to which a light emitting device according to some embodiments is applied.

Referring to FIG. 18, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes and the light emitting devices according to the embodiments described above.

The diffusive cover 1010 is disposed on the light emitting diode 1021 and may be secured to the body case 1031 to cover the light emitting diode 1021. The diffusive cover 1010 may be formed of or include a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 19:
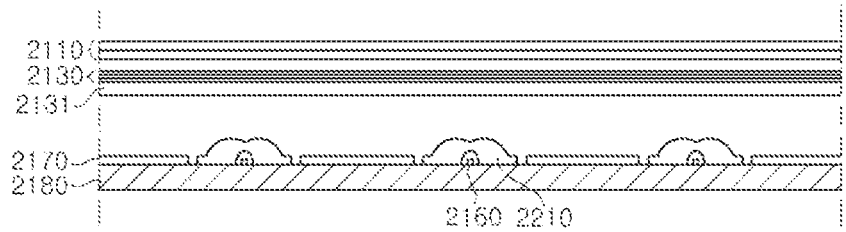
FIG. 19 and FIG. 20 are sectional views of an exemplary display device to which a light emitting device according to some exemplary embodiments.

FIG. 19 is a sectional view of an exemplary display device to which a light emitting device according to some embodiments is applied.

The display device according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. Here, the gate driving PCBs 2112 and 2113 may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide The substrate may be disposed under the reflective sheet 2170 to be surrounded by the reflective sheet 2170. However, it should be understood that other implementations are also possible. When a reflective material is coated onto a surface thereof, the substrate may be disposed on the reflective sheet 2170. Further, in this embodiment, a plurality of substrates may be arranged parallel to one other. However, it should be understood that other implementations are also possible and the light source module may include a single substrate.

The light emitting diodes 2160 may include at least one of the light emitting diodes and the light emitting devices according to the embodiments described above. The light emitting diodes 2160 may be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this way, the light emitting diodes according to some embodiments may be applied to direct type displays like the display according to this embodiment.

Figure 20:
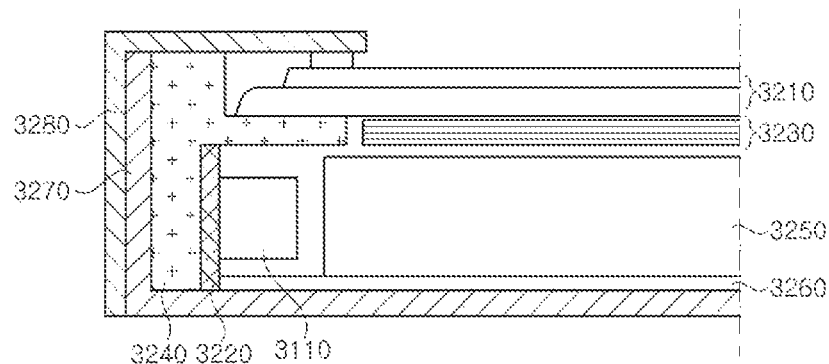

FIG. 20 is a sectional view of an exemplary display device to which a light emitting device according to some embodiments is applied.

The display device according to this embodiment includes a display panel 3210 on which an image is displayed, and a backlight unit disposed at a rear side of the display panel 3210 and emitting light thereto. Further, the display device includes a frame 240 supporting the display panel 3210 and receiving the backlight unit, and covers 3240 and 3280 surrounding the display panel 3210.

The display panel 3210 is not particularly limited and may be or include, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board.

The light emitting diodes 3110 may include at least one of the light emitting diodes and the light emitting devices according to the embodiments described herein. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the embodiments may be applied to edge type displays like the display according to this embodiment.

Figure 21:
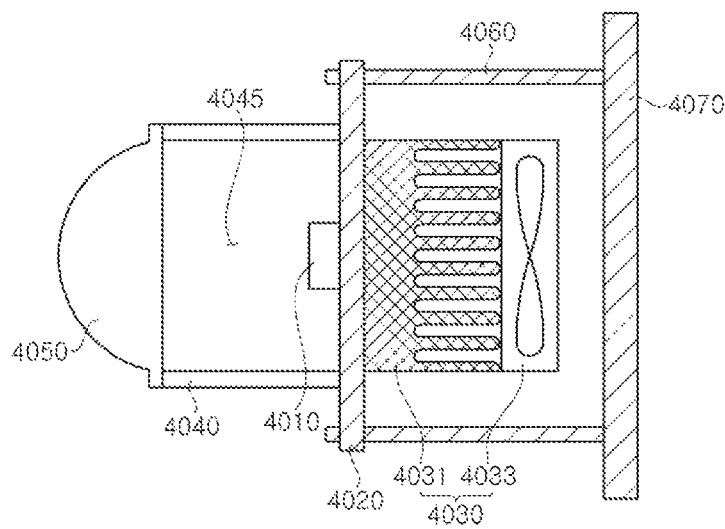
FIG. 21 is a sectional view of an exemplary headlight to which a light emitting device according to some exemplary embodiments.

FIG. 21 is a sectional view of an exemplary headlight to which a light emitting device according to some embodiments is applied.

Referring to FIG. 21, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be used without limitation. For example, the substrate 4020 may be or include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes and the light emitting devices according to some embodiments described herein.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of or include a light reflective material or coated therewith. On the other hand, the heat dissipation unit 4030 may include heat dissipation fins 4031 and/or a heat dissipation fan 4033, and dissipates heat generated upon operation of the light emitting diode 4010.

In this way, the light emitting diodes according to the embodiments described herein may be applied to headlights, particularly, headlights for vehicles, like the display device according to this embodiment.

Although some exemplary embodiments have been described herein, it should be understood by those skilled in the art that these embodiments are given by way of illustration only, and that various modifications, variations and alterations can be made without departing from the spirit and scope of the present disclosure.

What is claimed is:

1. A light emitting diode comprising:
a light emitting structure including a first conductive type semiconductor layer, a second conductive type semiconductor layer disposed on the first conductive type semiconductor layer, and an active layer interposed between the first and second conductive type semiconductor layers, and having at least one hole formed through the second conductive type semiconductor layer and the active layer to expose the first conductive type semiconductor layer therethrough;
a first electrode forming ohmic contact with the first conductive type semiconductor layer through the at least one hole of the light emitting structure;
a current spreading layer disposed on the second conductive type semiconductor layer and forming ohmic contact with the second conductive type semiconductor layer, the current spreading layer including a lower current spreading layer and an upper current spreading layer disposed on the lower current spreading layer, wherein the lower current spreading layer is disposed closer to the second conductive type semiconductor layer than is the upper current spreading layer;
a second electrode disposed on the current spreading layer;
an insulation layer covering the light emitting structure and the current spreading layer, and including openings partially exposing the first and second electrodes; and
a first pad and a second pad disposed on the insulation layer and electrically connected to the first and second electrodes, respectively,
wherein the upper current spreading layer and the lower current spreading layer have different electrical conductivities,
wherein the at least one hole includes a first hole disposed under the first pad and a second hole including a portion disposed under the first pad and a portion disposed under a gap between the first pad and the second pad, and
wherein the upper current spreading layer has a higher transmittance and a lower sheet resistance than the lower current spreading layer.

2. The light emitting diode of claim 1, further including:
a current blocking layer disposed under the current spreading layer,
wherein the current blocking layer is disposed at a location corresponding to the second electrode and under the second electrode.

3. The light emitting diode of claim 1, wherein the first electrode includes:
a first ohmic contact electrode disposed under the first pad and forming ohmic contact with the first conductive type semiconductor layer through the first hole; and
a second ohmic contact electrode including a main electrode disposed under the first pad, and an extension electrode extending from the main electrode to a portion under a region between the first pad and the second pad, the second ohmic contact electrode forming ohmic contact with the first conductive type semiconductor layer through the second hole.

4. The light emitting diode of claim 3, wherein the extension electrode of the second ohmic contact electrode further extends to a region under the second pad.

5. The light emitting diode of claim 4, wherein the extension electrode of the second ohmic contact electrode is covered by the insulation layer.

6. The light emitting diode of claim 1, wherein the second electrode includes:
a first connection electrode disposed under the second pad; and
a second connection electrode including a main electrode disposed under the second pad and an extension electrode extending from the main electrode to a portion under a region between the first pad and the second pad.

7. The light emitting diode of claim 6, wherein the extension electrode of the second connection electrode further extends to a region under the first pad.

8. The light emitting diode of claim 1, wherein the insulation layer includes a lower insulation layer and an upper insulation layer disposed on the lower insulation layer.

9. The light emitting diode of claim 8, wherein the lower insulation layer has a thickness that is greater than a thickness the upper insulation layer, and the upper insulation layer includes a distributed Bragg reflector.

10. The light emitting diode of claim 9, wherein the upper insulation layer includes at least two distributed Bragg reflectors reflecting light in different wavelength bands.

11. The light emitting diode of claim 9, wherein the distributed Bragg reflector comprises a first stack structure of stacked dielectric layers having a first thickness and a second stack structure of stacked dielectric layers having a second thickness.

12. The light emitting diode of claim 11, wherein the first thickness is smaller than ¼th of a center wavelength of visible light.

13. The light emitting diode of claim 11, wherein the distributed Bragg reflector further includes a third stack structure in which a first number of dielectric layers having a thickness greater than ¼th of a center wavelength of visible light and a second number of dielectric layers having a thickness smaller than ¼th of the center wavelength of visible light, alternately stacked one above another.

14. The light emitting diode of claim 1, wherein the current spreading layer includes a conductive oxide doped with a metal dopant.

15. The light emitting diode of claim 1, wherein the current spreading layer includes a transparent conductive oxide doped with at least one of Ga, Al and In.

16. The light emitting diode of claim 1, wherein the upper current spreading layer and the lower current spreading layer have different indexes of refraction.

17. The light emitting diode of claim 1, wherein the lower current spreading layer comprises undoped indium tin oxide (ITO).

18. The light emitting diode of claim 1, further including a heat dissipation pad disposed on the insulation layer and electrically insulated from the first electrode and the second electrode.

* * * * *